(12) United States Patent
Sugita et al.

(10) Patent No.: US 6,839,890 B2
(45) Date of Patent: Jan. 4, 2005

(54) MASK MANUFACTURING METHOD

(75) Inventors: Mitsuro Sugita, Tochigi (JP); Kenji Saitoh, Tochigi (JP); Kenji Yamazoe, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 143 days.

(21) Appl. No.: 10/247,947

(22) Filed: Sep. 20, 2002

(65) Prior Publication Data

US 2003/0233629 A1 Dec. 18, 2003

(30) Foreign Application Priority Data

Jun. 12, 2002 (JP) ........................................ 2002-171053

(51) Int. Cl.$^7$ .............................................. G06K 17/50
(52) U.S. Cl. .......................................... 716/19; 716/21
(58) Field of Search ..................................... 716/19, 21

(56) References Cited

U.S. PATENT DOCUMENTS

| | | | |
|---|---|---|---|
| 5,821,014 A | 10/1998 | Chen et al. | |
| 6,074,787 A | 6/2000 | Takeuchi | |
| 6,221,539 B1 * | 4/2001 | Kotani et al. | ................... 430/5 |
| 6,274,281 B1 * | 8/2001 | Chen | .............................. 430/5 |
| 6,294,295 B1 * | 9/2001 | Lin et al. | ........................ 430/5 |
| 6,355,382 B1 | 3/2002 | Yasuzato et al. | |
| 6,627,557 B2 * | 9/2003 | Seta et al. | ................... 438/717 |
| 2002/0045134 A1 | 4/2002 | Inoue et al. | |

* cited by examiner

Primary Examiner—Leigh M. Garbowski
Assistant Examiner—Brandon Bowers
(74) Attorney, Agent, or Firm—Morgan & Finnegan, L.L.P.

(57) ABSTRACT

A method for forming, on a mask, a mask pattern used for exposure. The mask pattern includes a first pattern that blends plural types of patterns, and second pattern that is smaller in size than the first pattern. The mask pattern is arranged on the mask so that the first pattern may be resolved and the second pattern is restrained from being resolved. The method includes the steps of classifying the first pattern into one of a periodic pattern having at least three elements having two equal intervals in at least one direction among two orthogonal directions, an isolated pair pattern that does not belong to the periodic pattern and includes a pair of elements arranged in at least one direction among the two orthogonal directions, and an isolated element that does not belong to the isolated pair pattern and includes only one element without constituting any pair in any of the two orthogonal directions, arranging the second pattern for the isolated pair pattern, arranging the second pattern for the isolated element, and arranging the second pattern for the periodic pattern.

32 Claims, 19 Drawing Sheets

WHEN THERE IS NO CLOSEST ELEMENT (L<6)
FOR ISOLATED PAIR OR ISOLATED ELEMENT

20b

21b

21c

MASK MANUFACTURING METHOD

BACKGROUND OF THE INVENTION

The present invention relates generally to exposure, and more particularly to methods for forming a pattern on a mask or reticle (these terms are used interchangeably in this application). The present invention is suitably applicable, for example, to exposure apparatuses and methods, device fabricating methods, and devices fabricated from an exposed object or a target object, wherein the exposure apparatus and method are used to fabricate various devices including semiconductor chips such as ICs and LSIs, display devices such as liquid crystal panels, sensing devices such as magnetic heads, and image pick-up devices such as CCDs, as well as minute contact hole patterns used for micromechanics. Here, the micromechanics is technology for applying the semiconductor IC fabricating technique for fine structure fabrications, thereby creating an enhanced mechanical system that may operate at a level of micron.

The conventional photolithography has used a projection exposure apparatus that transfers a mask pattern onto a wafer through a projection optical system. Various improvements have been proposed for the fine photolithography process, which generally include a shorter exposure wavelength and/or a larger numerical aperture (NA) of the projection optical system in the projection exposure apparatus.

Mask patterns include an adjacent and cyclic line and space (L & S) pattern, and a contact-hole pattern that has a line of adjacent and cyclic contact holes (i.e., arranged at the same interval or pitch as the hole diameter). Generally speaking, the L & S pattern is more easily resolved than the contact-hole pattern. Therefore, there has been a demand to expose a line of contact holes with resolution as high as that of the L & S pattern.

As a solution for this problem, a method for forming fine contact holes has recently been proposed which arranges, around a desired contact-hole pattern, a dummy or auxiliary contact-hole pattern having a hole diameter smaller than that of the desired contact-hole pattern (these terms, i.e., "dummy" and "auxiliary", are used interchangeably in this application) so as to resolve only the desired contact-hole pattern.

As this method deals with the desired pattern that includes only a line of periodic contact holes, the way of arranging the auxiliary pattern is clear. However, the way of arranging the auxiliary pattern has not conventionally been proposed for such a desired pattern as blends a line of contact holes and isolated contact hole(s). In particular, the recent semiconductor industry has been shifting its production to a system chip that includes highly value-added and various types of patterns, and thus it has become necessary to form plural types of contact-hole patterns on a mask.

Conventionally, designers have manually arranged an auxiliary pattern with trial and error for a desired pattern that blends a line of contact holes and isolated contact hole(s), and this case has a problem in that the desired pattern cannot necessarily be exposed with high resolution. The auxiliary pattern is originally added to enhance the periodicity of the desired pattern, and the periodicity of the desired pattern depends upon a combination of contact holes. It is not always easy to combine which contact holes in which directions.

On the other hand, it is conceivable to use double exposure (or multi-exposure) that employs two masks and expose different types of patterns independently. However, the double exposure has many practical issues to be solved including the increased cost due to two masks, lowered throughput due to two exposures, and high overlay accuracy over two mask exchanges.

BRIEF SUMMARY OF THE INVENTION

Accordingly, it is an exemplary object of the present invention to provide an exposure method and apparatus that can expose, without exchanging a mask, a contact hole pattern that has a fine hole diameter (e.g., of 0.15 $\mu$m or less) and blends from an (isolated) contact hole to a contact hole line, with high resolution.

A method of one aspect of the present invention for forming, on a mask, a mask pattern used for exposure, which mask pattern includes a first pattern that blends plural types of patterns, and second pattern that is smaller in size than the first pattern, the mask pattern being arranged on the mask so that the first pattern may be resolved and the second pattern is prevented from being resolved includes the steps of classifying the first pattern into one of a periodic pattern having at least three elements having two equal intervals in at least one direction among two orthogonal directions, an isolated pair pattern that does not belong to the periodic pattern and includes a pair of elements arranged in at least one direction among the two orthogonal directions, and an isolated element that does not belong to the isolated pair pattern and includes only one element without constituting any pair in any of the two orthogonal directions, arranging the second pattern for the isolated pair pattern, arranging the second pattern for the isolated element, and arranging the second pattern for the periodic pattern.

The step of arranging the second pattern for the isolated element may arrange the second pattern utilizing an oblique vector from the isolated element to the isolated pair pattern. The step of arranging the second pattern for the isolated element may arrange the second pattern utilizing a width of the isolated element. The method may further include the step of fusing first and second elements where the second pattern includes the first and second elements, and an interval between the first and second elements is within a predetermined distance.

The method may further include the step of arranging only one of first and second elements where the second pattern includes the first and second elements, and an interval between the first and second elements is within a predetermined distance. The first and second elements may be preferentially provided to the isolated pair pattern, the isolated element and the periodic pattern in this order. The first and second elements are preferentially provided to a smaller periodic pattern among two different periodic patterns.

The first and second elements may be preferentially provided to a periodic pattern with a smaller interval among two different isolated pair pattern. The interval may be 2 or less when converted into $\lambda/(4NA)$ as a unit where $\lambda$ is a wavelength of exposure light, and NA is a numerical aperture of a projection optical system for transferring the mask pattern onto an object to be exposed. The interval may be a distance of 1 or less between two closest parts of two elements when converted into $\lambda/(4NA)$ as a unit where $\lambda$ is a wavelength of exposure light, and NA is a numerical aperture of a projection optical system for transferring the mask pattern onto an object to be exposed.

The step of arranging the second pattern for the isolated pair pattern may include the step of arranging two additional elements of the second pattern outside the isolated pair pattern at an interval of the isolated pair pattern in an arranged direction of the isolated pair pattern. The step of arranging two additional elements of the second pattern may utilize a vector from one to the other in the pair of elements in the isolated pair pattern. The step of arranging two additional elements of the second pattern may utilize a vector that is formed by connecting both centers of gravity in the additional elements, to arrange the additional elements if an interval between two closest parts of the pair of elements in the isolated pair pattern in an arrangement direction is about 1 or larger when converted into $\lambda/(4NA)$ as a unit where $\lambda$ is a wavelength of exposure light, and NA is a numerical aperture of a projection optical system for transferring the mask pattern onto an object to be exposed, and wherein the step of arranging two additional elements of the second pattern utilizes a vector that is parallel to the arrangement direction of the isolated pair pattern, has a length of about 2, and includes a center positioned approximately at a center of an element interval, to arrange the additional elements if an interval between two closest parts of the pair of elements in the isolated pair pattern in an arrangement direction is about 1 or less when converted into $\lambda/(4NA)$. The step of arranging the second pattern for the isolated pair pattern may include the step of arranging the second pattern, outside the second pattern arranged outside the isolated pair pattern, in a direction perpendicular to an arrangement direction of the isolated pair pattern.

The step of arranging the second pattern for the isolated pair pattern may include the step of arranging the second pattern in a direction perpendicular to an arrangement direction of the isolated pair pattern outside the isolated pair pattern, utilizing the element in the isolated pair pattern.

The step of arranging the second pattern for the periodic pattern may include the step of arranging two elements of the second pattern in an arrangement direction of the at least three elements outside the periodic pattern at an interval of the at least three elements. The step of arranging the second pattern for the periodic pattern may include the step of arranging the second pattern, outside the second pattern arranged outside the isolated pair pattern, in a direction perpendicular to an arrangement direction of the at least three elements.

The method may further include the step of arranging the second pattern by expanding the second pattern that has already been arranged. The step of expanding utilizes a vector used for the second pattern that has already been arranged.

The classifying step may include the steps of detecting another element closest in the two orthogonal directions to an object element included in the first pattern, determining, when the closest element has been detected, whether there is another element in a detected direction at a position from the closest element as a starting point using a first vector from the object element to the closest element, determining whether there is another element in a direction opposite to the detected direction at a position from the closest element as a starting point using a second vector from the closest element to the object element; and determining that the object element is the periodic pattern when two or more other elements are detected to exist in two directions along at least one line on which the object element is placed.

The method may further include the step of determining that an element in the periodic pattern is an element at a border of the periodic pattern, when there is no other element at a position at an extension of the first or second vector in at least one direction from the element as a starting point in the periodic pattern. The method may further include the step of arranging the second pattern using the first and/or second vectors from the element at the border.

The method may further include the step of determining that the element is a side element at the border in the periodic pattern when the number of directions is one in which there is no other element at an extension of the first or second vector in one direction, and that the element is a vertex element in the periodic pattern when the number of directions is two in which there is no other element at an extension of the first or second vector in one direction. The method may further include the step of arranging the second pattern for the vertex element utilizing the second pattern that has already been arranged and a vector different from that used to arrange the second pattern that has already been arranged.

The step of arranging the second pattern in an arrangement direction of the isolated pair pattern may arrange the second pattern between the isolated pair pattern when an interval between the isolated pair pattern is larger than a predetermined distance. The predetermined distance may be about 4 or greater when converted into $\lambda/(4NA)$ as a unit where $\lambda$ is a wavelength of exposure light, and NA is a numerical aperture of a projection optical system for transferring the mask pattern onto an object to be exposed.

The step of arranging the second pattern in the arrangement direction of the isolated pair pattern for the isolated pair pattern may include the step of arranging two elements of the second pattern outside the isolated pair pattern in the arrangement direction at an interval between one of the isolated pair pattern and an element of the second pattern arranged between the isolated pair pattern.

The classifying step may consider there are two isolated elements when an interval between the pair of elements arranged in any one of the two orthogonal directions is greater than a predetermined distance. The predetermined distance is about 6 or greater when converted into $\lambda/(4NA)$ as a unit where $\lambda$ is a wavelength of exposure light, and NA is a numerical aperture of a projection optical system for transferring the mask pattern onto an object to be exposed.

The step of arranging the second pattern for the isolated element includes the steps of detecting the closest element other than the two orthogonal directions, calculating third and fourth vectors by projecting a vector from the closest element to the isolated element in the two orthogonal directions, and arranging an element in the second pattern at a position at an extension of the third vector and at an extension of the fourth vector from the isolated element as a starting point. The closest element belongs to the isolated pair pattern.

Other aspects of the present invention also rest in not only the mask used for exposure which has a mask pattern formed by any one of the above methods, but also a device fabricating method including the steps of exposing the first pattern on the mask and performing a predetermined process for the exposed object. Claims for the device fabricating method cover devices as their intermediate products and finished products. Such devices include, for example, semiconductor chips such as LSIs and VLSIs, CCDs, LCDs, magnetic sensors, thin-film magnetic heads, etc.

Other objects and further features of the present invention will become readily apparent from the following description of the embodiments with reference to accompanying drawings.

DETAILED DESCRIPTION OF THE PREFERRED EMBODIMENTS

First Embodiment

Figure 1:
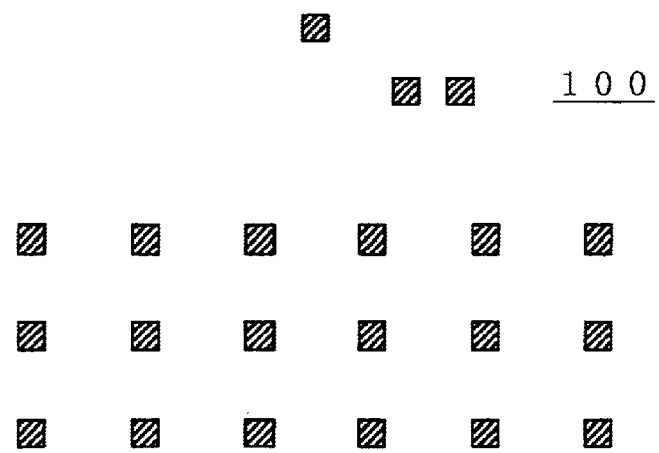
FIG. 1 typically shows a desired pattern.
Figure 2:
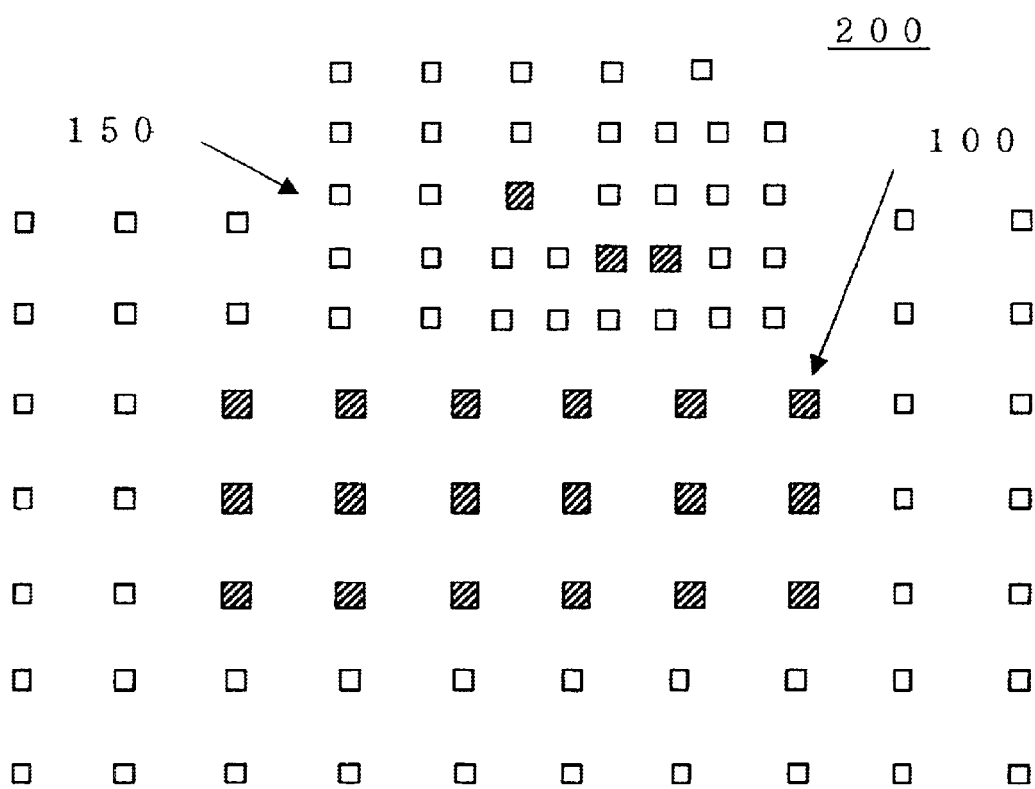
FIG. 2 typical shows a mask pattern used for exposure.
Figure 24A:
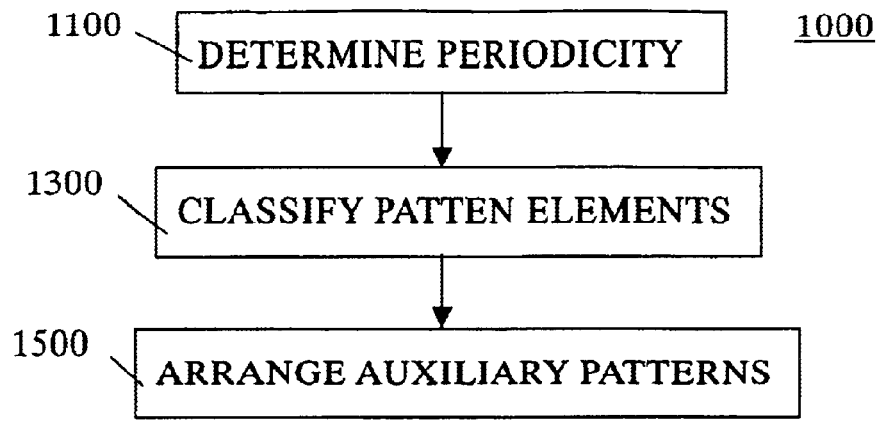
FIG. 24 shows three flowcharts of a mask producing method or mask pattern forming method according to the present invention.
Figure 24B:
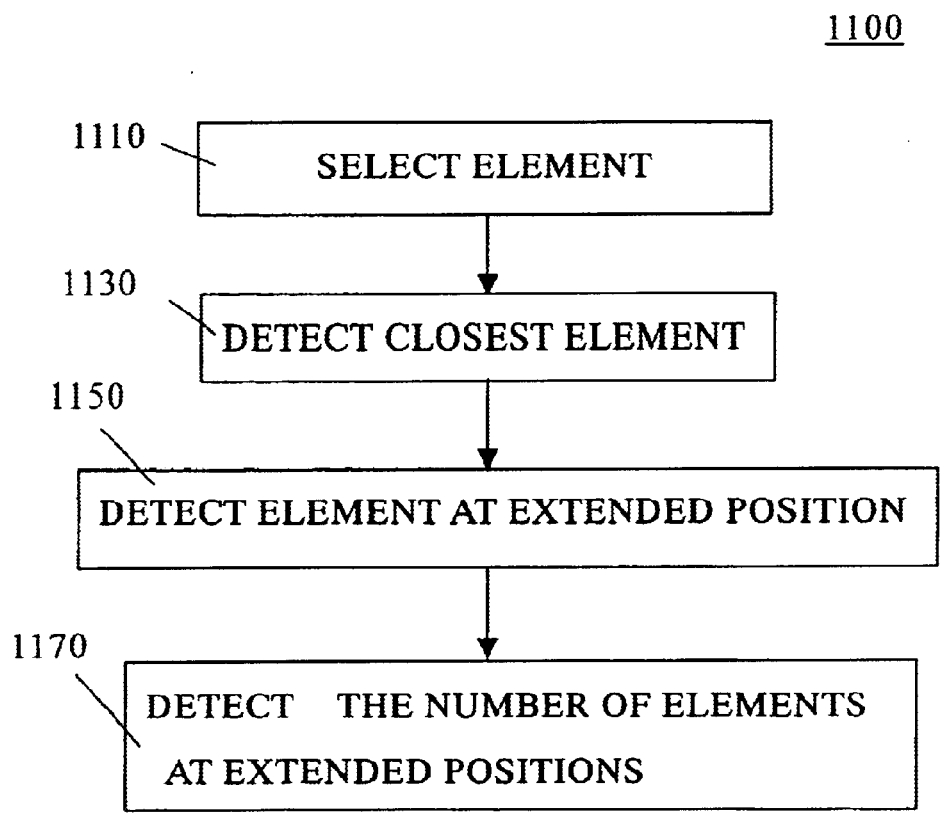
Figure 24C:
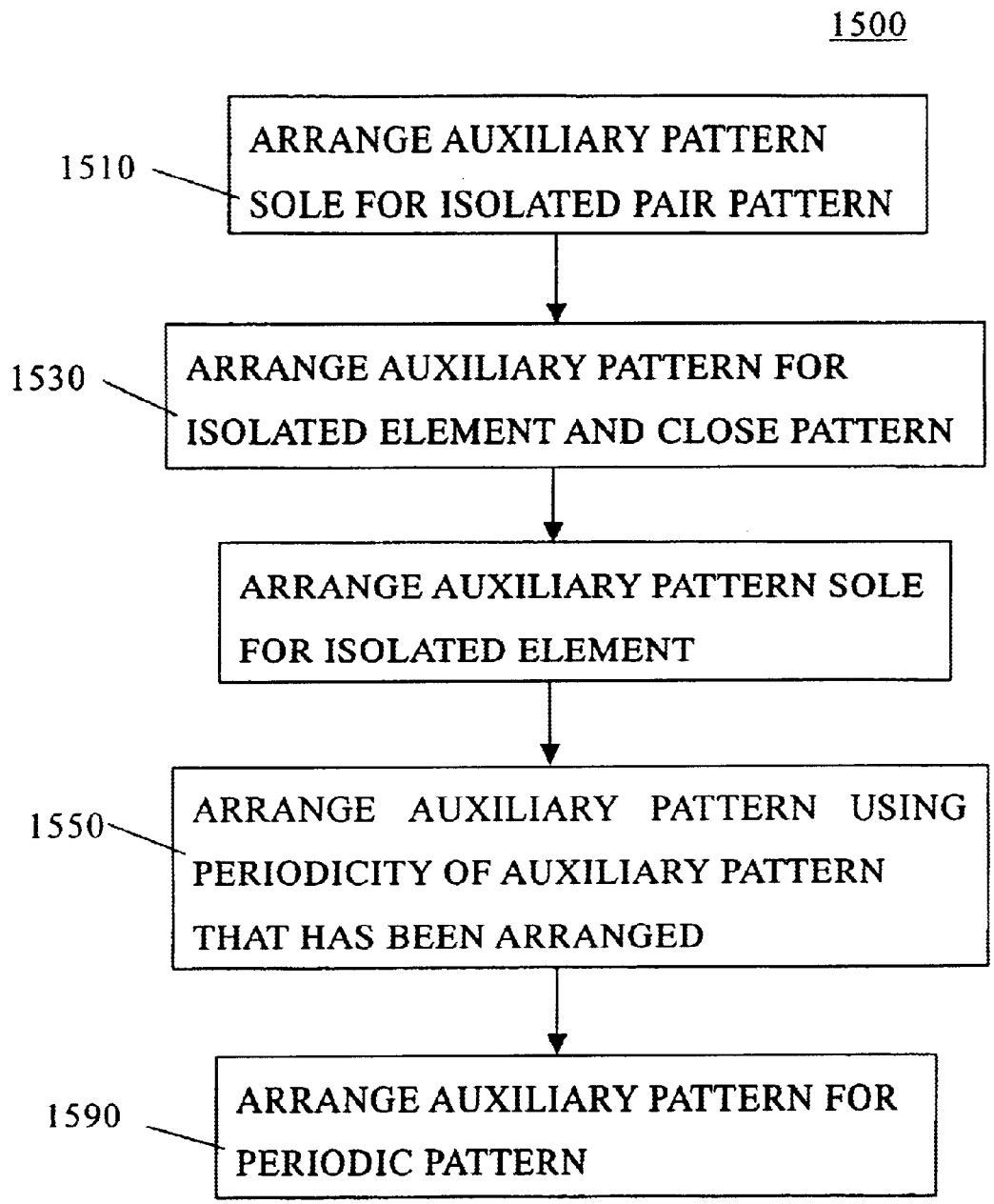

A description will be given with reference to FIGS. 1–21. FIG. 1 shows a desired pattern 100, and a mask pattern 200 is produced as shown in FIG. 2 by adding an auxiliary pattern 150. A description will now be given of this exemplary production following steps. FIGS. 3–6 illustrate a step of detecting the periodicity of each partial pattern in the desired pattern 100 (corresponding to step 1100 in FIG. 24A) and a step of classifying these partial patterns (corresponding to step 1300 in FIG. 24A). FIG. 24B is a flowchart for explaining details of determination of periodicity (i.e., step 1100) in FIG. 24A. FIG. 24C is a flowchart for explaining details of the arrangement of auxiliary pattern (i.e., step 1500) in FIG. 24C.

Figure 3:
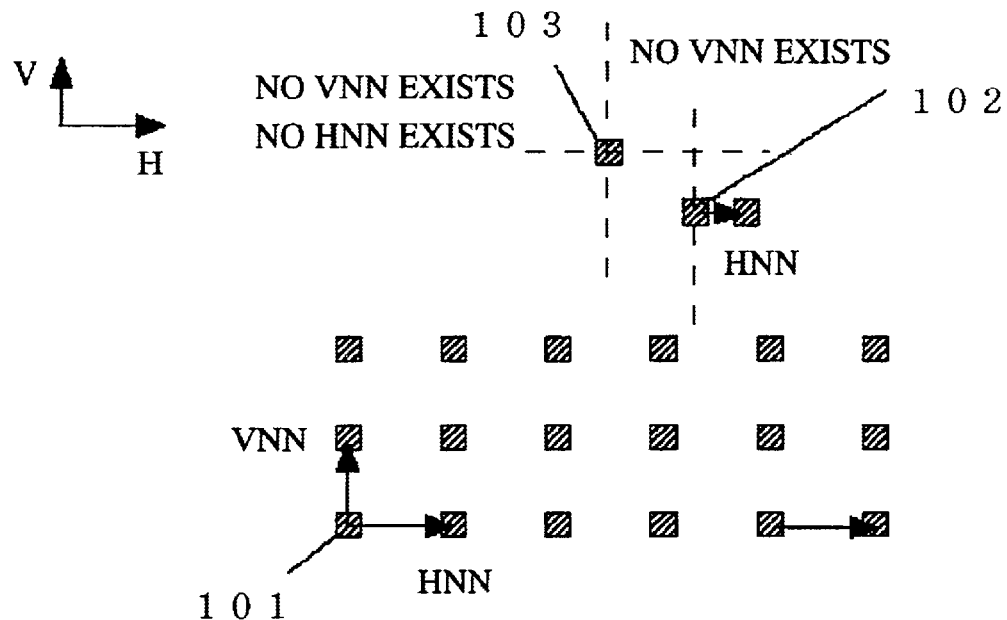
FIG. 3 typically shows a detection of the closest element.

Referring to FIG. 3, step 1 detects the closest element to each element or contact hole in longitudinal and lateral directions. Here, elements 101, 102 and 103 are exemplarily used. When the closest element to the element 101 is searched for in four directions, i.e., longitudinally and laterally with respect to longitudinal line V and lateral line H, Hnn in the right direction and Vnn in the upper direction are detected for the element 101. Hnn is detected for the element 102 in the right direction along the lateral line H. There is no element for the element 103 in any one of four directions.

Figure 4:
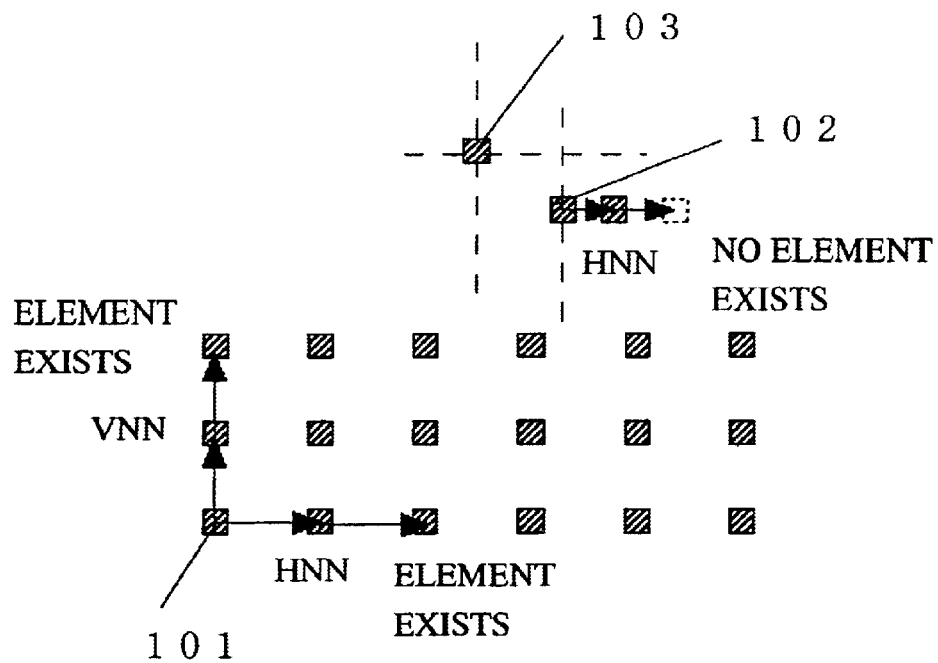
FIG. 4 typically shows detections of elements so as to determine the periodicity.
Figure 5:
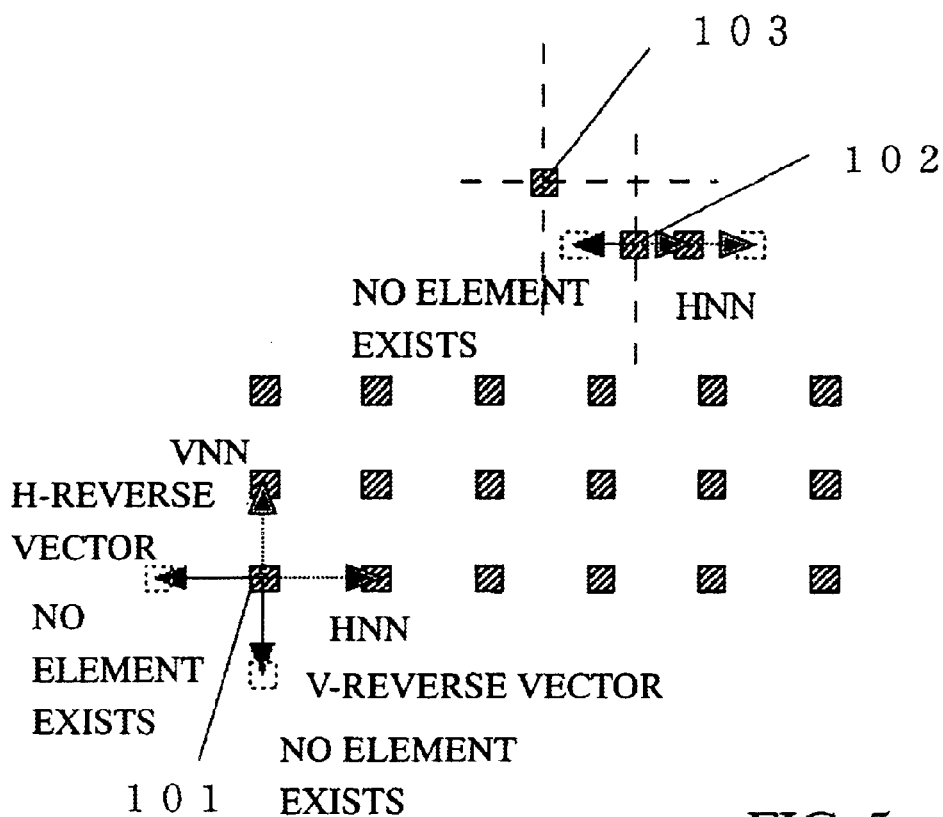
FIG. 5 typically shows detections of elements in a reverse direction so as to determine the periodicity.

Step 2 then determines, as shown in FIG. 4, whether there is another element for each of the elements 101 and 102, for which the closest elements have been detected. For example, a vector from the element 101 to the right closest element Hnn is extended to determine whether there is another element from the closest element Hnn as a starting point, and the other element is found in this case. Similarly, another element is found for the element 101 in the upper Vnn direction. On the other hand, there is no other element for the element 102 at an extended position in the right Hnn direction. It is then determined, as shown in FIG. 5, whether there is another element at extended positions from the elements 101 and 102 using reverse vectors (each of which has the same length but an opposite direction) from these elements 101 and 102 to their closest elements. Although it is checked whether there is another element in the left direction from the element 101, i.e., opposite to the right Hnn direction, and in the lower direction from the element 101, i.e., opposite to the upper Vnn direction, there is no element at these positions. Although it is checked whether there is another element in the left direction from the element 102, i.e., opposite to the right Hnn direction, there is no element at the position.

Figure 6:
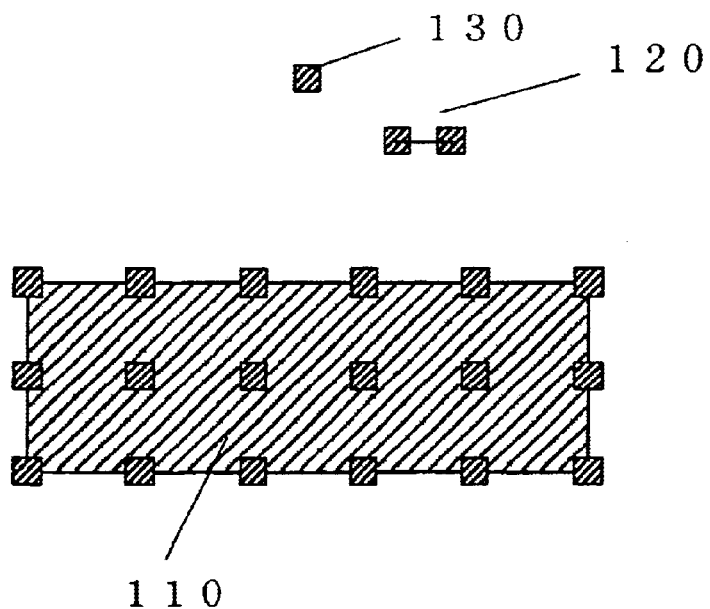
FIG. 6 typically shows classified patterns and their elements as a result of the determination of the determination.

In step 3, the determination of periodicity of each partial pattern to which the element belongs uses, as detailed below, the result of detections of the closest elements and other elements at periodic and extended positions in the forward and backward directions. First, two or more closest and other elements are detected for the element 101 at the extended position(s) in the right and left directions along the lateral line. Based on this information, it is determined that the element 101 is an element that belongs to a laterally periodic pattern. Similarly, as two or more elements are detected for the element 101 at the extended position(s) in the upper and lower directions along the longitudinal line, it is determined that the element 101 is an element that belongs to a longitudinally periodic pattern. Each element is similarly checked, and classified into a set of elements that belong to such a periodic pattern 110, as shown in FIG. 6. Only one closest element is detected for the element 102 at an extended position with respect to four directions along longitudinal and lateral lines. Therefore, the element 102 is an element that belongs to the isolated pair pattern 120, as shown in FIG. 6. The other element in the pair is similarly determined, and these two elements are classified into a set of elements that belong to the isolated pair pattern 120. On the other hand, there is no element for the element 103 in the four longitudinal and lateral directions. Therefore, this element is classified into an isolated element 130, as shown in FIG. 6, which solely forms a pattern.

Figure 7:
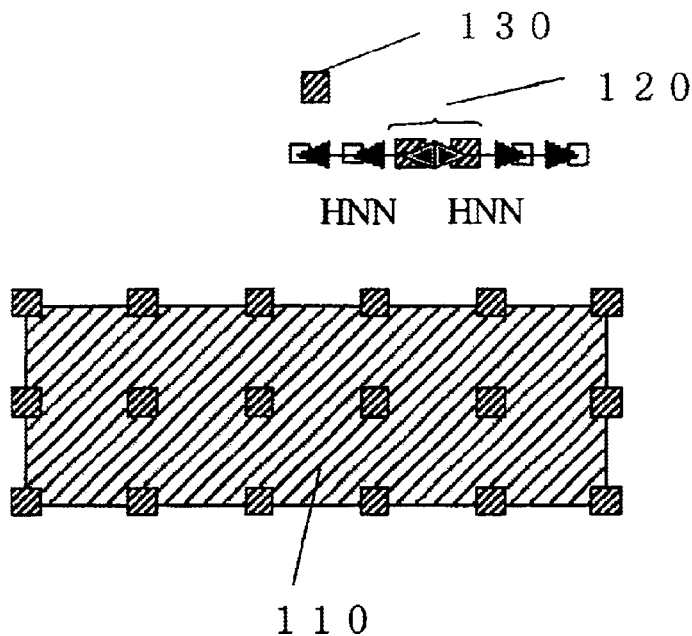
FIG. 7 typically shows one way of arranging new elements of an auxiliary pattern for an isolated pair pattern.

Step 4 and subsequent steps additionally arrange new elements of the auxiliary pattern 150, giving preference to the isolated pair pattern 120. FIG. 7 shows this arrangement. Two elements in the pair are the closest elements to each other, and new elements are additionally arranged at extended positions using a vector between these closest elements. The size of the auxiliary pattern is 1 or less when converted into $\lambda/(4NA)$ as a unit that is the resolution limit of the two-beam interference where $\lambda$ is a wavelength of exposure light, and NA is a numerical aperture of a projection optical system. The auxiliary pattern preferably keeps away from being resolved in the actual exposure result. It is also preferable that the number of new elements added as the auxiliary pattern is two periods or more at both sides, and the proper number of added periods avoids the interference with other adjacent patterns.

Figure 8:
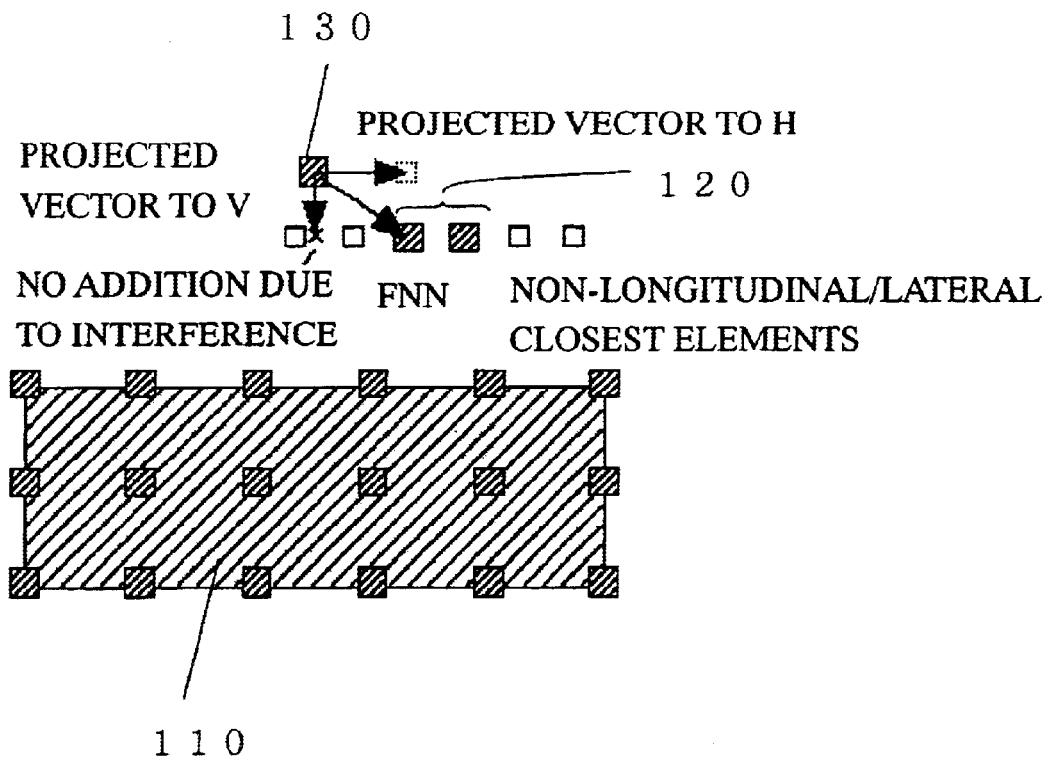
FIG. 8 typically shows one way of arranging new elements of the auxiliary pattern using a relationship between an isolated element and the isolated pair pattern.

Step 5 then adds new elements based on the isolated element 130. FIG. 8 shows this addition. As there is no closest element to the isolated element 130 in the longitudinal and lateral directions, the closest element is tried to be detected in an arbitrary direction other than the longitudinal and lateral directions. In this case, the left element in the isolated pair pattern 120 is the closest element. The vector to this closest element is in an oblique direction, and the projected vectors are obtained in the longitudinal axis and lateral axis. New elements for the auxiliary pattern 150 are additionally arranged at extended positions from the isolated element 130 as a starting point.

Figure 9:
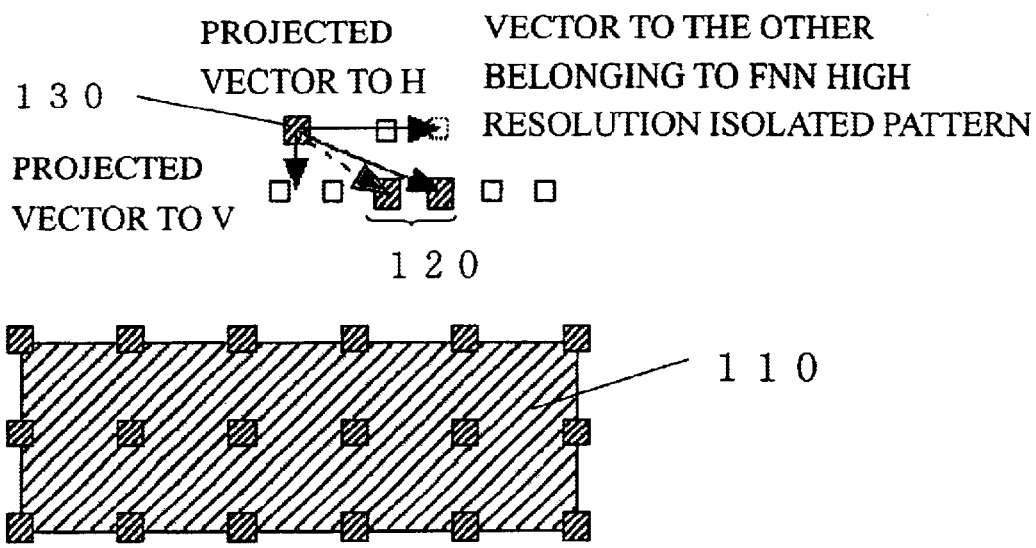
FIG. 9 typically shows another way of arranging new elements of the auxiliary pattern using a relationship between the isolated element and the isolated pair pattern.

Step 6 conducts the same procedure for the other (or right in this case) element in the isolated pair pattern 120. As shown in FIG. 9, similar to the step 5, an oblique vector from the isolated element 130 is obtained and new elements are arranged using the longitudinally and laterally projected vectors.

Figure 10:
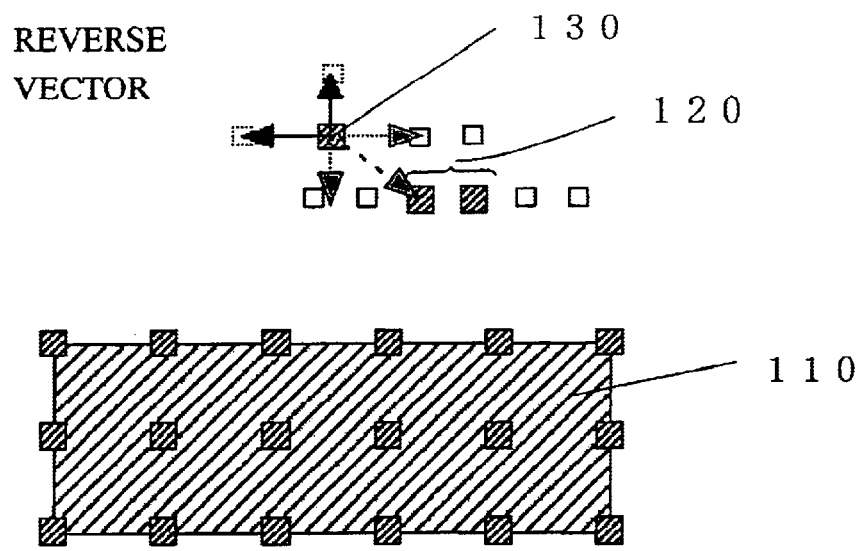
FIG. 10 typically shows still another way of arranging new elements of the auxiliary pattern using a relationship between the isolated element and the isolated pair pattern.

Step 7 then adds arranges new elements of the auxiliary pattern at extended positions from the isolated element 130 as a starting point using vectors reverse to longitudinally and laterally projected vectors used for steps 5 and 6. FIG. 10 shows this addition.

Figure 11:
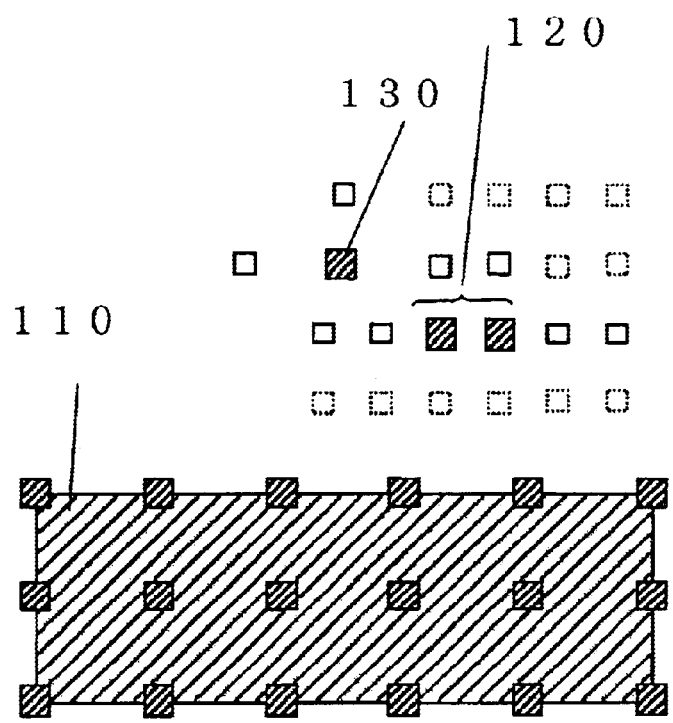
FIG. 11 typically shows one way of additionally arranging new elements of the auxiliary pattern for the isolated pair pattern using the periodicity with the additionally arranged auxiliary pattern elements.
Figure 12:
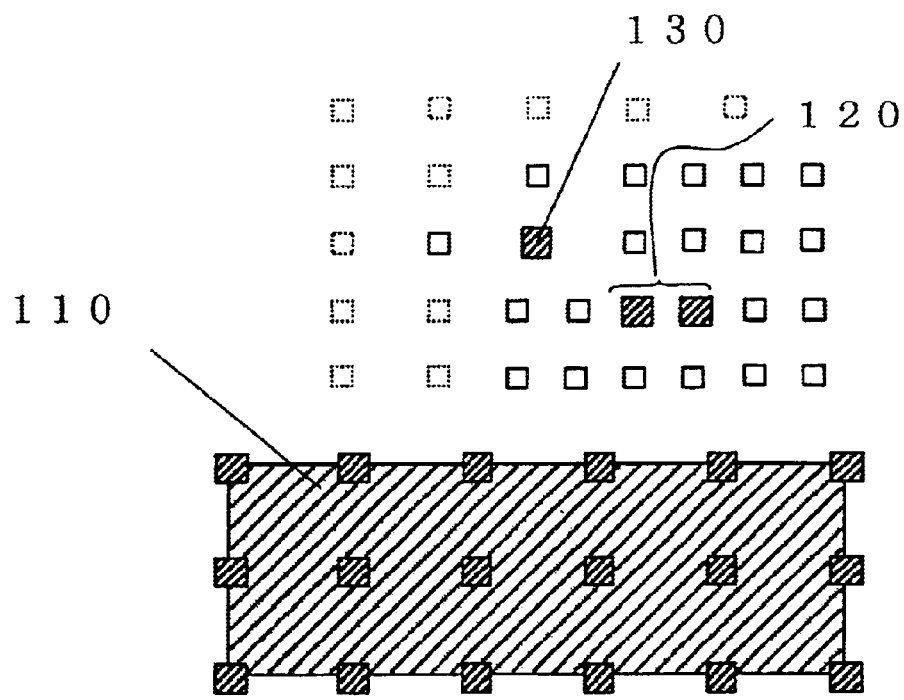
FIG. 12 typically shows one way of additionally arranging new elements of the auxiliary pattern for the isolated element using the periodicity with the additionally arranged auxiliary pattern elements.

These steps 4–7 provide the isolated pair pattern 120 and isolated element 130 with new elements of the auxiliary patterns, and consequently the isolated pair pattern 120 and isolated element 130 come to exhibit the periodicity with the new elements. Step 8 adds new elements for the isolated pair pattern 120 and isolated element 130 utilizing the new periodicity generated as a result of newly arranged, peripheral auxiliary pattern 150. In other words, the auxiliary pattern is added (for two periods) to the isolated pair pattern 120 by considering new elements to be the existing elements, which have been added as the auxiliary pattern, and the elements that used to belong to the isolated pair pattern to be periodic. This embodiment additionally arranges new elements, as shown in FIG. 11, for the isolated pair pattern 120 using the vector from the element that has been added. Similarly, two periods of auxiliary patterns are added to the isolated element, as shown in FIG. 12, by utilizing the periodicity that is generated utilizing the new element as existing elements that have been additionally arranged as the auxiliary pattern 150, and providing the element belonging to the isolated pair pattern with the periodicity. Thus, the additional arrangement of the new elements of the auxiliary pattern is completed for the isolated pair pattern 120 and isolated element 130 which have high priority.

Figure 13:
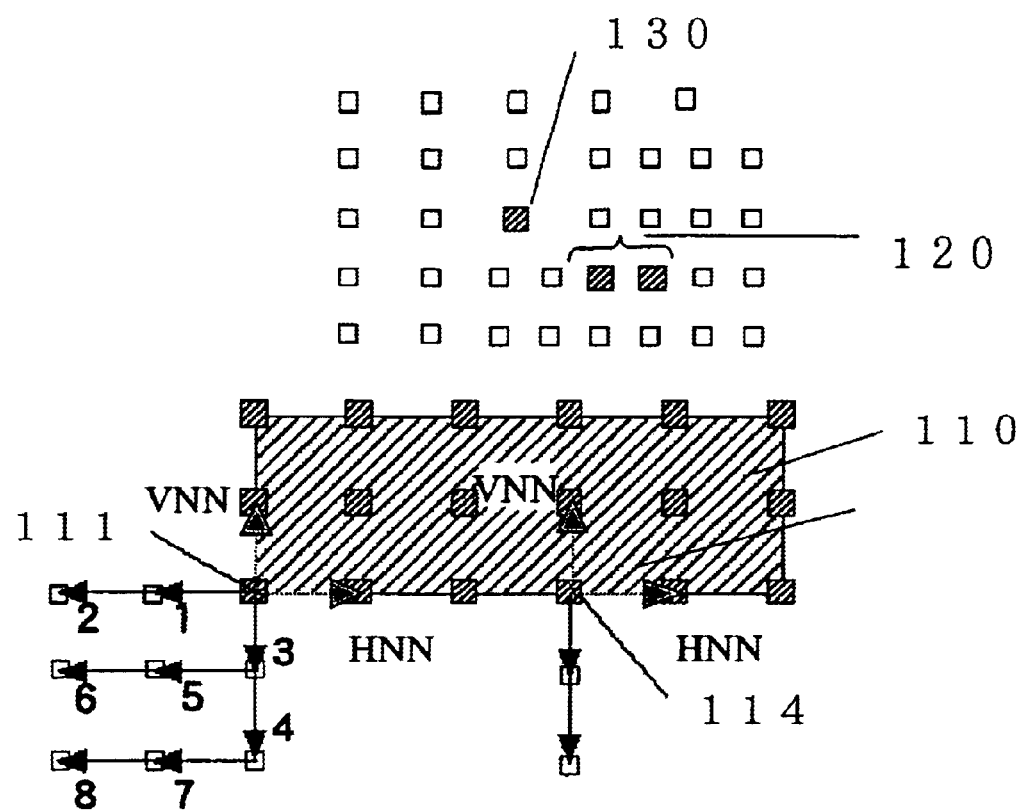
FIG. 13 typically shows one way of arranging new elements of the auxiliary pattern using the periodic pattern and its elements at the border.

Step 9 additionally arranges new elements of the auxiliary pattern for the periodic pattern 110 that has been set up with low priority in this embodiment. As shown in FIG. 13, the new elements of the auxiliary pattern 150 for the periodic pattern 110 are generated from the elements 111 and 114 located at the border of the periodic pattern 110. Therefore, the border elements belonging to the periodic pattern 110 are detected first. The detection uses information of the determination of the periodicity that finds no element in a certain direction, like the element 101 in FIG. 5. There is no element in two directions for the element 101. Such an element is a border vertex element 111 of the periodic pattern 110 as shown in FIG. 13. An element 114 shown in FIG. 13 does not have a counterpart at an extended position in only one direction, and such an element is determined to be a border side element of the periodic pattern 110. After the boarder elements and their kinds are detected, the instant embodiment adds new elements of the auxiliary pattern 150 as shown in FIG. 13. First, new elements are added to the element 114 as the border side element at an extended position from the element 114 as a starting point, using a vector from the upper closest element Vnn to the element 114, the upper closest element Vnn being located in an upper direction reverse to the lower direction in which there is no element for the element 114. Then, a new element is arranged at an extended position from the new element as a starting point using the same vector so as to extend the auxiliary patterns by two periods. Then, new elements are additionally arranged for the element 111 as a border vertex element in accordance with depicted numbers. In other words, the periodic auxiliary patterns are extended at positions (1, 2, 3 and 4) in two directions using two vectors from the closest elements Hnn to the element 111 and from the closest element Vnn to the element 111, similar to the side boarder element, and then at extended positions (5, 6, 7 and 8) by combining two vectors.

Figure 14:
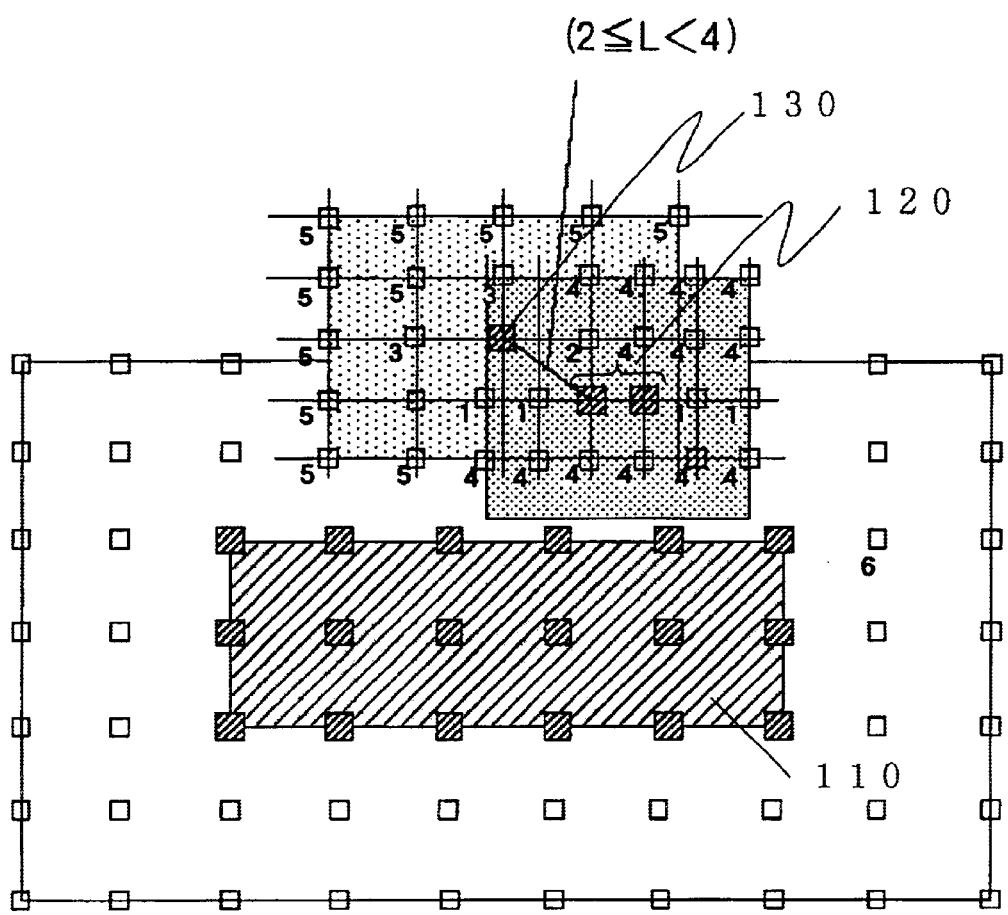
FIG. 14 typically shows a pattern classification (including an area for two periods at the periphery) for determining the order and priority of the additional arrangement of the auxiliary pattern of the first embodiment.

In step 10, FIG. 14 typically shows the pattern classification (including an area for two periods at the periphery) for determining the order and priority of the additional arrangement of the auxiliary pattern of the first embodiment. Here, a distance L between the isolated element and adjacent left element in the isolated pair pattern is 2 when converted into $\lambda/(4NA)$ as a unit.

Figure 15:
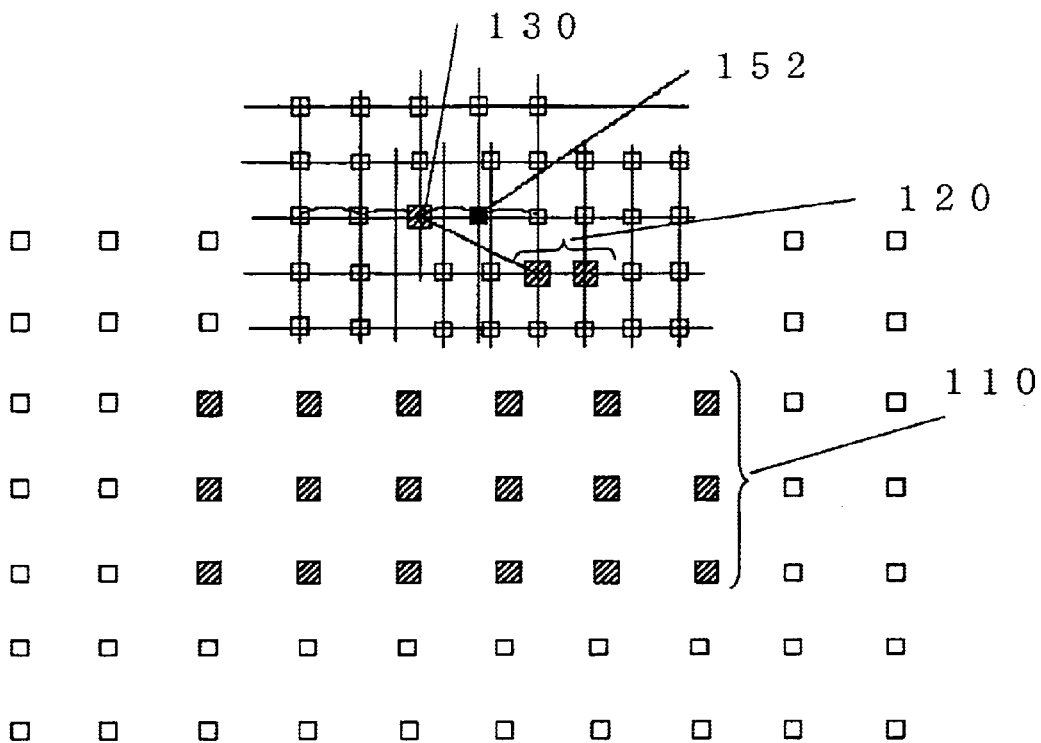
FIG. 15 typically shows one way of additionally arranging middle elements of the auxiliary pattern when an interval between the closest elements in an arbitrary direction has a predetermined length for a desired pattern with another condition.

FIG. 15 typically shows one way of additionally arranging middle elements 152 of the auxiliary pattern 150 when an interval between closest elements in an arbitrary direction has a predetermined length for the desired pattern 100 with another condition ($4 \leq L < 6$ in FIG. 15). In this case, whether $4 \leq L < 6$ is first determined and then whether the projected vectors in the longitudinal axis (V) and lateral axis (H) have lengths $L_{-V}$ and $L_{-H}$ of 4 or greater is determined. The middle element 152 is $L_{-V}$ and $L_{-H}$ arranged when the lengths are 4 or greater. In FIG. 15, the middle element 152 is arranged in the lateral direction because $L_{-V} < 4$ and $L_{-H} > 4$.

Figure 16:
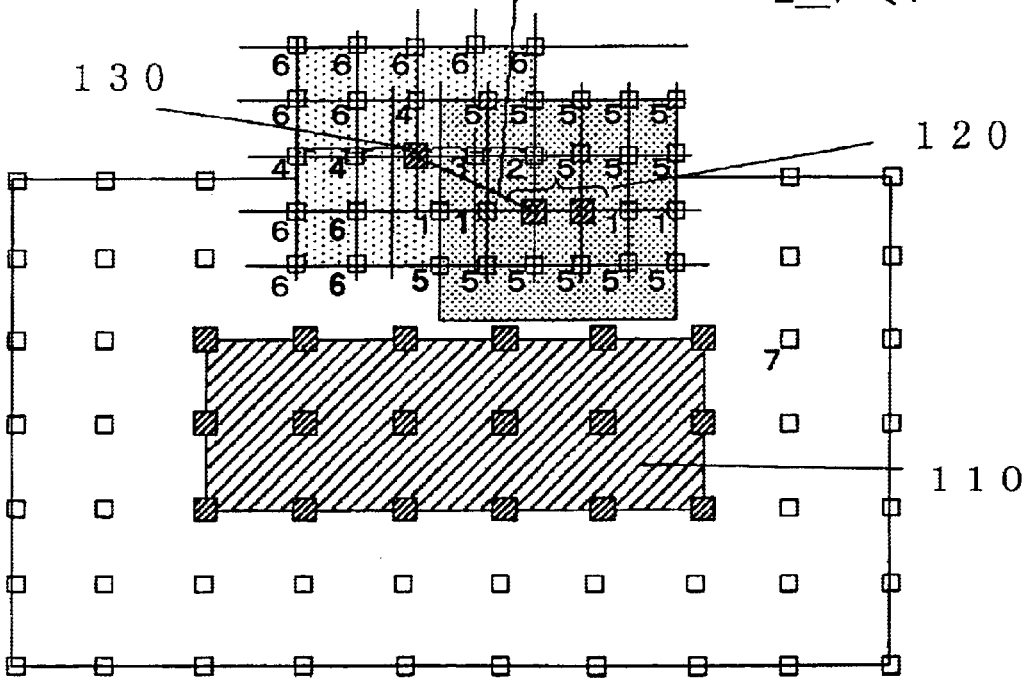
FIG. 16 typically shows a pattern classification (including an area for two periods at the periphery) for determining the order and priority of the additional arrangement of the auxiliary pattern.

FIG. 16 typically shows the pattern classification (including an area for two periods at the periphery) for determining the order and priority of the additional arrangement of the auxiliary pattern of the first embodiment.

Figure 17:
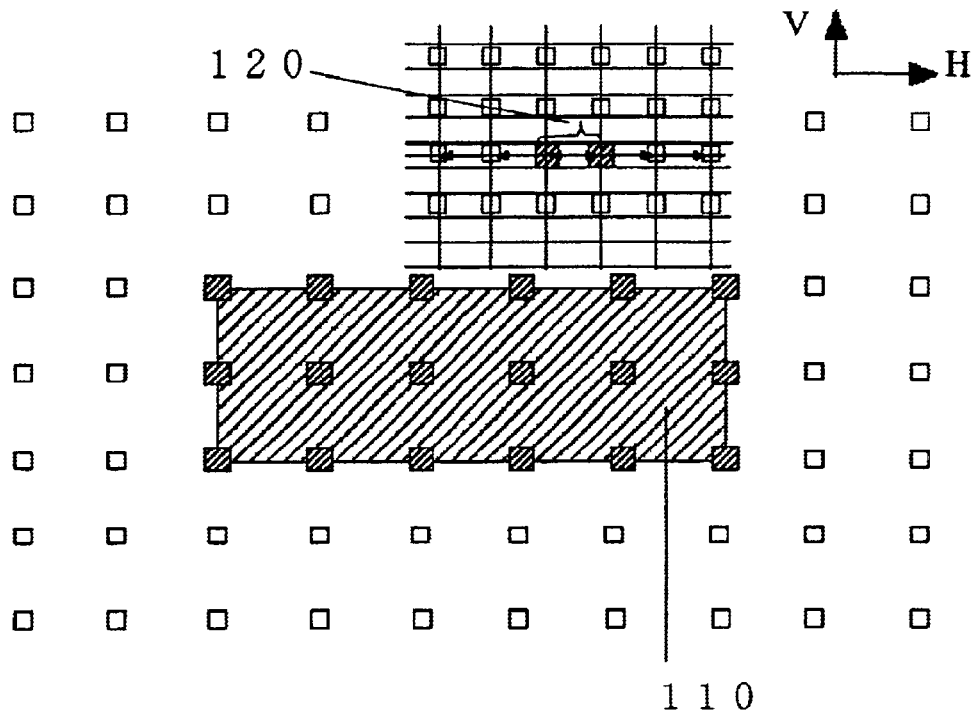
FIG. 17 typical shows one way of arranging new elements of the periodic auxiliary pattern using an element width in a direction perpendicular to a direction connecting the pair when there is no closest isolated element for the isolated pair pattern.

FIG. 17 typically shows one way of arranging new elements the periodic auxiliary pattern using an element width in a direction perpendicular to a direction connecting the-pair when there is no closest isolated element for the isolated pair pattern.

Figure 18:
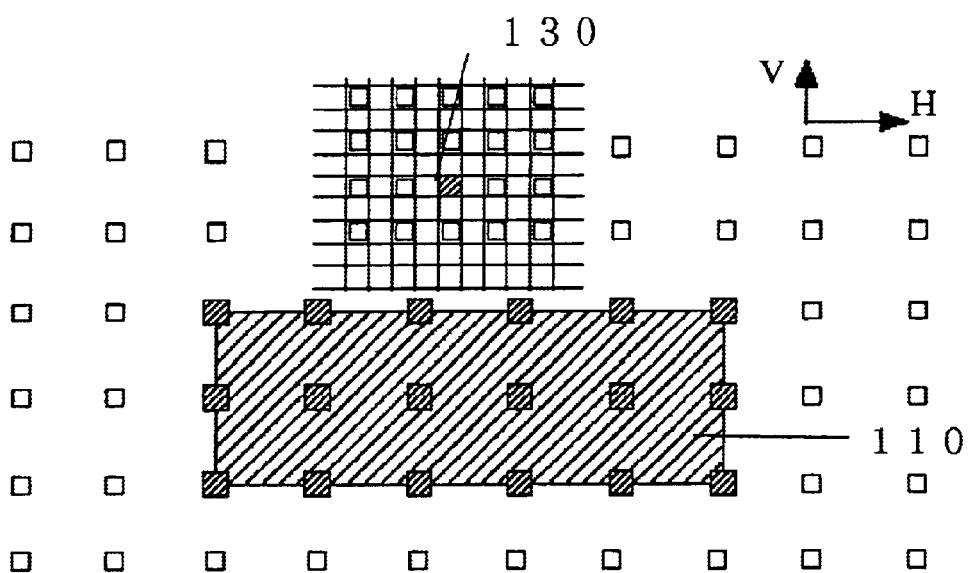
FIG. 18 typically shows one way of arranging new elements of the periodic auxiliary pattern using the element width in longitudinal and lateral directions for isolated element.

FIG. 18 typically shows one way of arranging new elements of the periodic auxiliary pattern using the element width in longitudinal and lateral directions for isolated element 130.

FIG. 2 shows a result of the additional arrangement of new elements of the auxiliary pattern 150 derived from the periodic pattern 110 in a way of step 9, although no new elements are arranged which would interfere with already existing another pattern, i.e., existing elements of the auxiliary pattern derived from the isolated pair pattern 120 and isolated element 130. The detection of interference in this embodiment requires a condition that a distance between two centers of gravity is 2 or less when converted into $\lambda/(4NA)$ as a unit. Alternatively, this condition may be properly replaced with the determination standard that requires the minimum distance between element edges is 1 or less when converted into $\lambda/(4NA)$ as a unit.

In this way, the instant embodiment uses steps 1–10 to form the exposure mask pattern that adds the auxiliary pattern 150 as shown in FIG. 2 to the desired pattern 100 shown in FIG. 1. The algorithm of this embodiment may arrange, at proper positions, the auxiliary pattern that enhances the periodicities in the desired pattern 100 that blends patterns of various periods, thereby improving exposure using this exposure mask 200.

Second Embodiment

Figure 19:
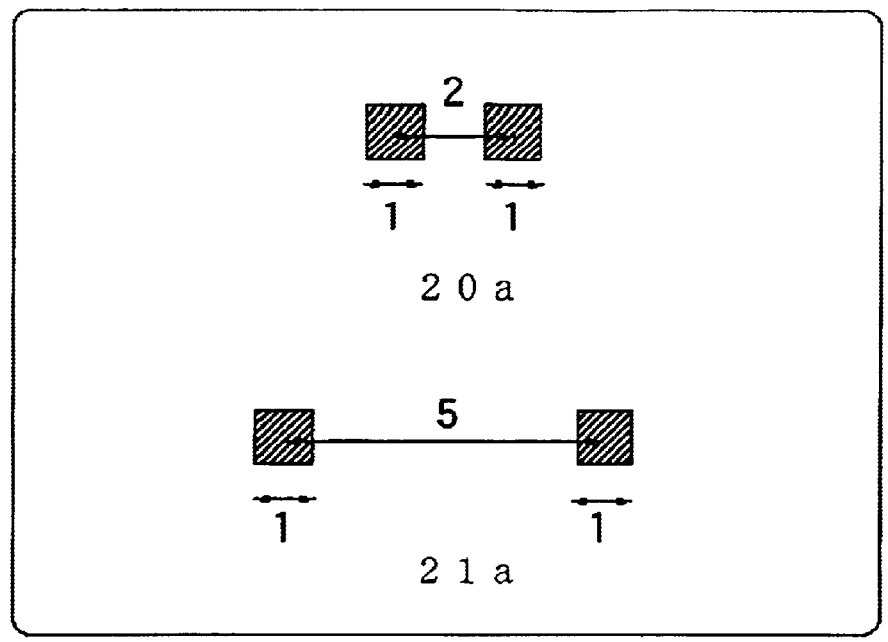
FIG. 19 typically shows a variation of the isolated pair pattern and a method for changing an arrangement of new elements of the auxiliary pattern in accordance with the configuration.
Figure 19:
Figure 19:
Figure 19:

This embodiment proposes another method for arranging new elements of the auxiliary pattern for the isolated pair pattern 120 as a variation of the first embodiment. As shown in FIG. 19, various variations of the size and distance between pairs as a pattern are conceivable, such as patterns 20a and 20b. The instant embodiment identifies the size and distance using $\lambda/(4NA)$ as a unit, and changes the method of adding auxiliary pattern based on the information.

In FIG. 19, the pattern 20a has an element with a size of 1, and a distance of 2 between centers of gravity of elements. The periodicity of such a pattern is similar to the periodic pattern 110 in an exposure system realized by using two-beam interference for the resolution limit. In this case, as shown in the first embodiment, the auxiliary pattern is added to both sides of this pattern, like the pattern 20b, while the periodicity is maintained.

The pattern 21a has an element with a size of 1 and a distance of 1 between centers of gravity of the elements. In case of such a pattern, the interval is wider in comparison with the element size element and resolution limit, and the periodicity becomes worse when the process proceeds as it is. Accordingly, as the pattern 21b, a new element of the auxiliary pattern is added to the middle of two elements in the pair. Next, new elements of the auxiliary pattern is additionally arranged at periodic positions outside the pair, like the pattern 21c, using a vector connecting this new element and the element in the pair.

Figure 20A:
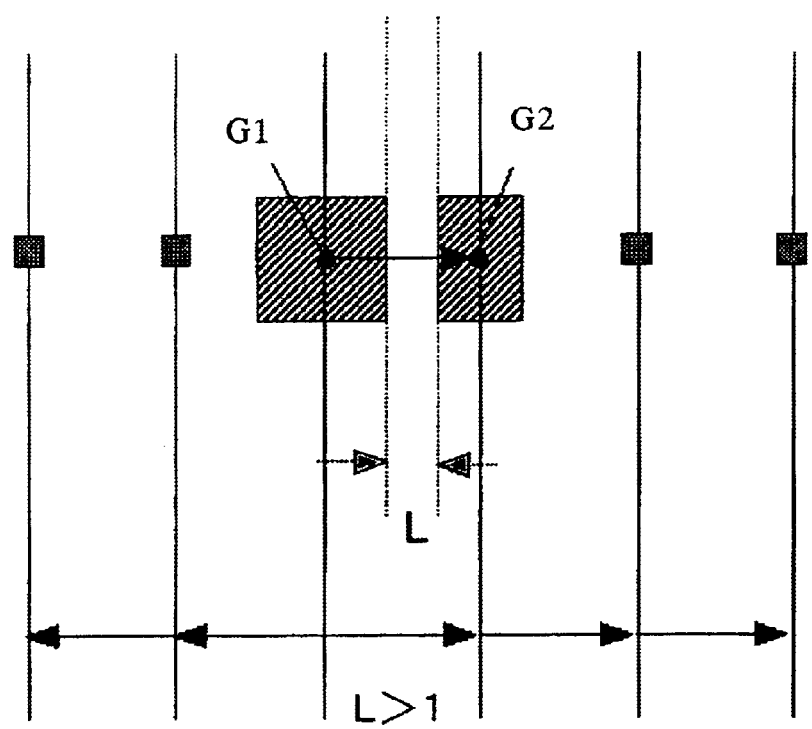
FIG. 20 typically shows another variation of the isolated pair pattern and a method for changing an arrangement of new elements of the auxiliary pattern in accordance with the configuration.
Figure 20B:
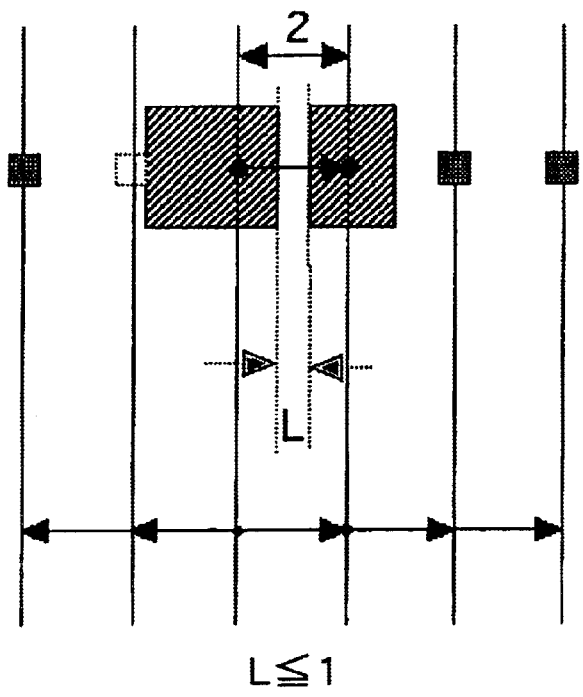

A description will now be given of the treatment especially of narrow interval between elements as shown in FIG. 20, when a size of two elements of the isolated pair pattern is not about 1, approximately as large as a so-called contact hole, when converted into $\lambda/(4NA)$ as a unit, but is such a large element having a size of 2 or greater. In case of FIG. 20A, the size of the element is two or greater and the element interval is 1 or greater. In case of such an isolated pair pattern, it is relatively easy to resolve the element interval and thus a vector connecting centers of gravity of two elements is used to arrange the auxiliary pattern by stressing the periodicity of the entire element rather than the element interval. On the other hand, in case of FIG. 20B, the size of the element is the same, but the element interval is 1 or less, which is less than the resolution limit, and it is very difficult to resolve this interval. In case of such an isolated pair pattern, it is preferable to arrange the auxiliary pattern with a period of 2 as the resolution limit to fit the interval by stressing the element interval that is hard to be resolved rather than the periodicity of the entire elements. In other words, the auxiliary pattern with the period of 2 is arranged at the extension of the element having the length of 2 using a vector that has its center at the center of the interval.

In this way, the instant embodiment arranges the auxiliary pattern for various, practically sought or desired isolated pair patterns by considering the element size and interval, and realizes the exposure mask pattern 200 that adds the nature of the exposure system, thereby improving exposure using this exposure mask 200.

Third Embodiment

Figure 21:
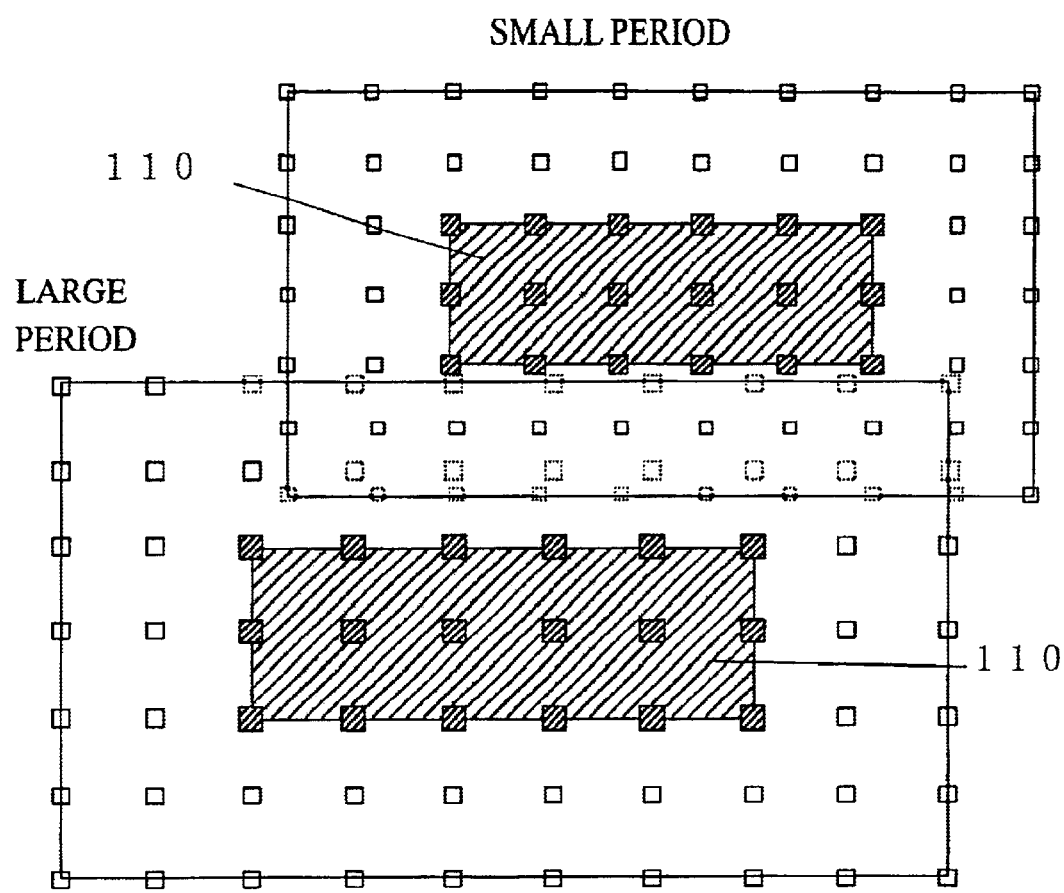
FIG. 21 typically shows an exemplary treatment when the auxiliary patterns for two periodic patterns with different periods interfere with each other.

This embodiment deals with interferences between auxiliary patterns in an attempt to additionally arrange the auxiliary pattern for plural periodic patterns 110 after the method of the first embodiment detects the periodicity of the desired pattern 100. FIG. 21 shows this embodiment. FIG. 21 shows two types of periodic patterns 110 with different periods, and thus an overlapping area would exist when the auxiliary patterns are additionally arranged.

Figure 22:
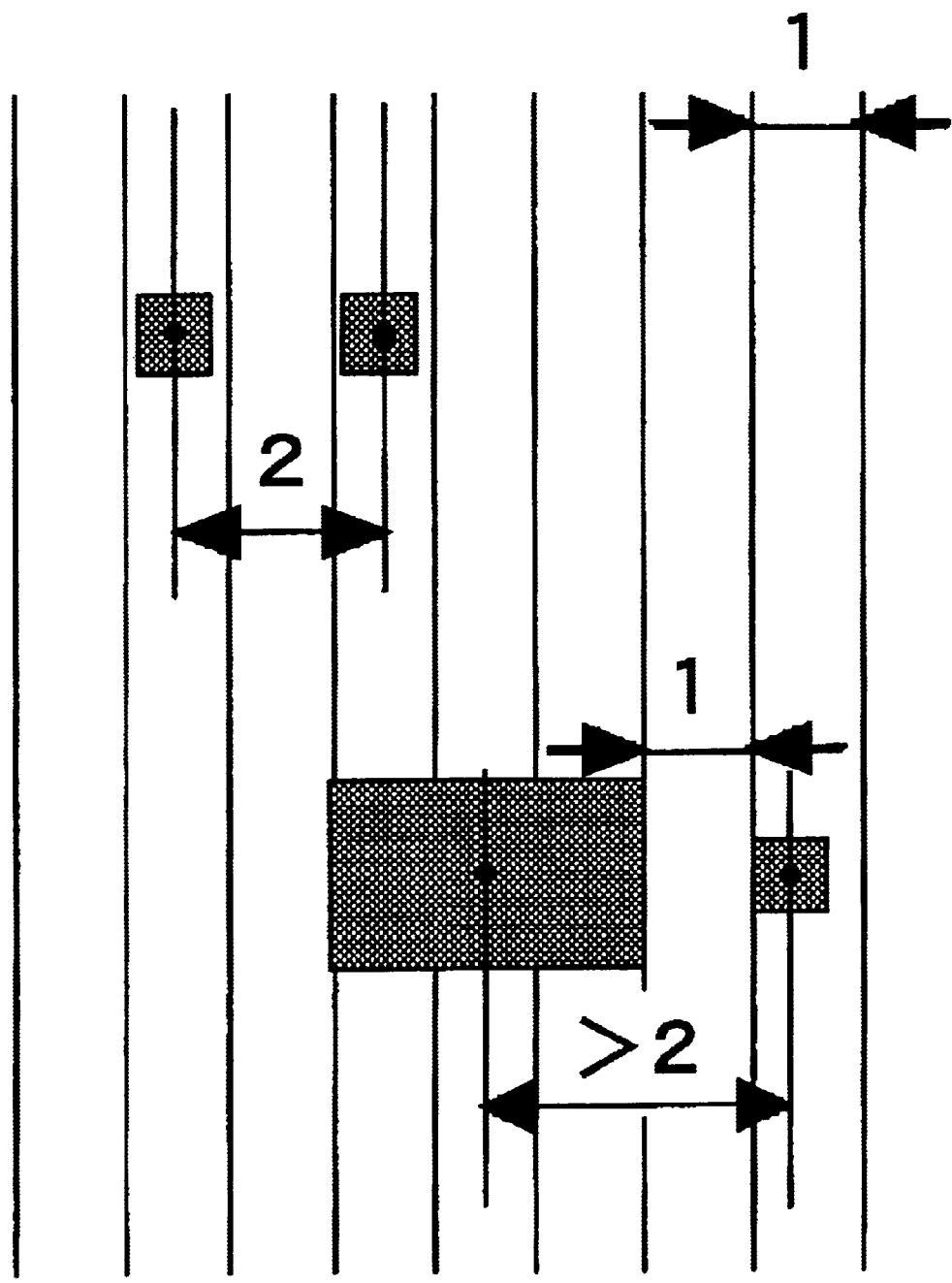
FIG. 22 typically shows an exemplary determination standard regarding the interference between auxiliary patterns.

In such an overlapping area, two new elements that are to be additionally arranged or a new element and an existing element belonging to the desired pattern would be located close to each other or partially overlap each other. Such interference between elements is determined by checking the interval between the elements, but it is preferable to change the standard of the distance to be determined in accordance with the size of the element. As shown in FIG. 22, the instant embodiment preferably uses the distance between centers of gravity for the distance to check interference, for example, between upper left new elements in the auxiliary patterns, and determines that the distance when converted into $\lambda/(4NA)$ as a unit is 2 or less is the interference as the standard of period for the resolution limit. On the other hand, the elements include a size of 1 or greater in the desired pattern as shown at the lower right side in FIG. 22. Then, even when the distance between centers of gravity of these elements is 2 or greater, the distance between edges of the elements is 1 or smaller. Accordingly, it is preferable to determine that the distance between edges of the elements is 1 or less indicates the interference.

The instant embodiment preferentially arranges the auxiliary pattern derived from the periodic pattern 110 with a small period as shown in FIG. 21 for the overlapping area when the above method determines that there is the interference. This arrangement would mitigate the deterioration of exposed images at the area having the small period and maintain permissible the deterioration of exposed images at the area having the large period, in comparison with a case where the periodic pattern 110 with a large period takes preference.

Fourth Embodiment

Figure 23:
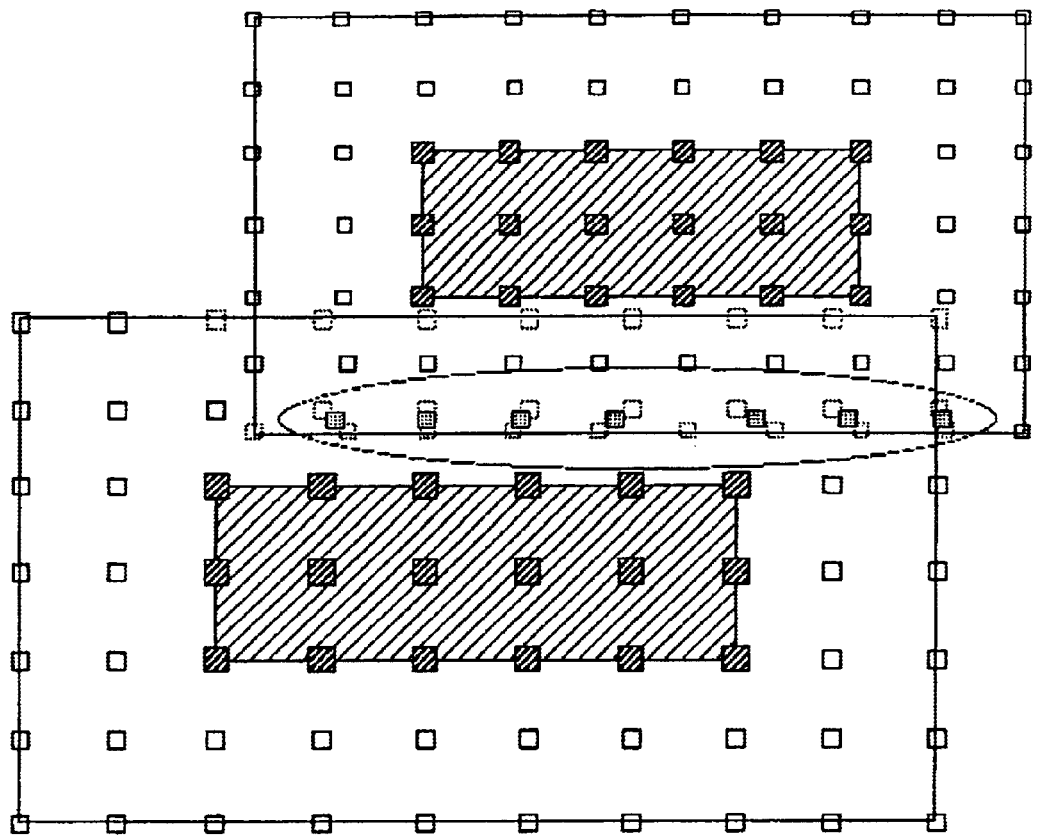
FIG. 23 typically shows another exemplary treatment when the auxiliary patterns for two periodic patterns with different periods interfere with each other.

The instant embodiment deals differently with interferences between auxiliary patterns in an attempt to additionally arrange the auxiliary pattern for plural periodic patterns 110 after the method of the first embodiment detects the periodicity of the desired pattern 100. FIG. 23 shows this embodiment. FIG. 23 shows two types of periodic patterns 110 with different periods, and thus an overlapping area would exist when the auxiliary patterns are additionally arranged. The instant embodiment preferentially arranges the auxiliary pattern derived from the periodic pattern 110 with a small period in such an overlapping area. Then, if the auxiliary pattern derived from the periodic pattern 110 with a small period and the auxiliary pattern derived from the periodic pattern 110 with a large period are so close that the distance between them is about 1 which is converted into $\lambda/(4NA)$ as a unit, the instant embodiment arranges one representative element by fusing two elements to be added at the center of these two elements. This arrangement would result in effective exposure because the instant embodiment may reduce the shortage area of the auxiliary pattern and avoid interference between auxiliary patterns derived from different periods.

Fifth Embodiments

FIG. 24 is a flowchart of a mask producing method or mask pattern forming method according to the present invention. The inventive mask producing method includes the steps of determining the periodicity (step 1100), classifying an element in a pattern (step 1300), and arranging the auxiliary pattern 150 (step 1500).

The step of determining the periodicity (step 1100) includes, more specifically, the steps of selecting an element (step 1110), detecting the closest element (step 1130), detecting an element at an extended position (step 1150), and detecting the number of elements located at extended positions (step 1170).

The step of arranging the auxiliary patten 150 includes the steps of arranging the auxiliary patten 150 for the isolated pair pattern 120 solely (step 1510), arranging the auxiliary pattern 150 for the isolated element 130 and close pattern (step 1530), arranging the auxiliary pattern 150 for the isolated element 130 solely (step 1550), arranging the auxiliary pattern 150 utilizing the periodicity of the element of the existing auxiliary pattern 150 (step 1570), and arranging the auxiliary pattern 150 for the periodic pattern 110 (step 1590).

Figure 25:
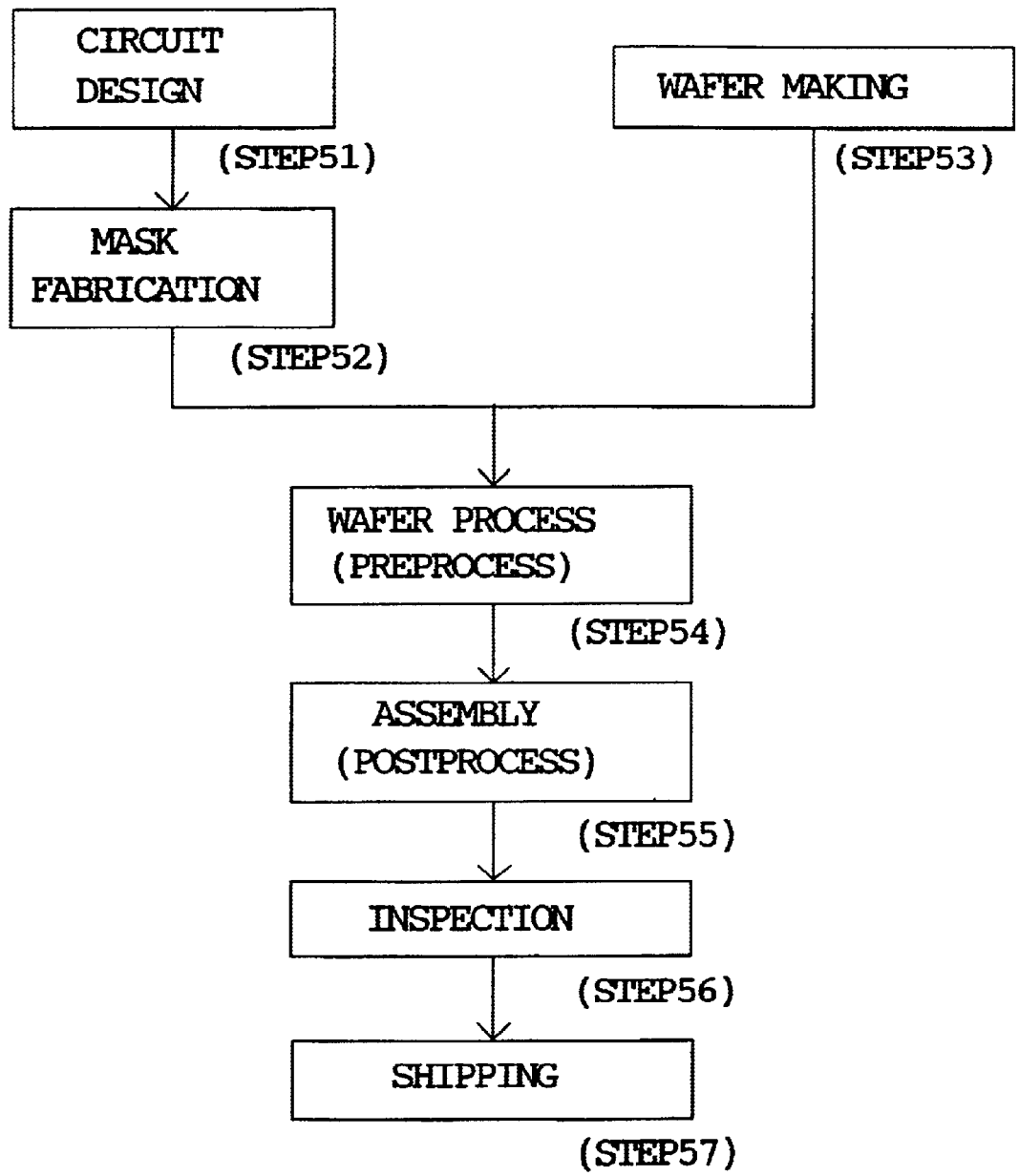
FIG. 25 is a flowchart for explaining a device fabricating method using the exposure apparatus of the present invention.
Figure 26:
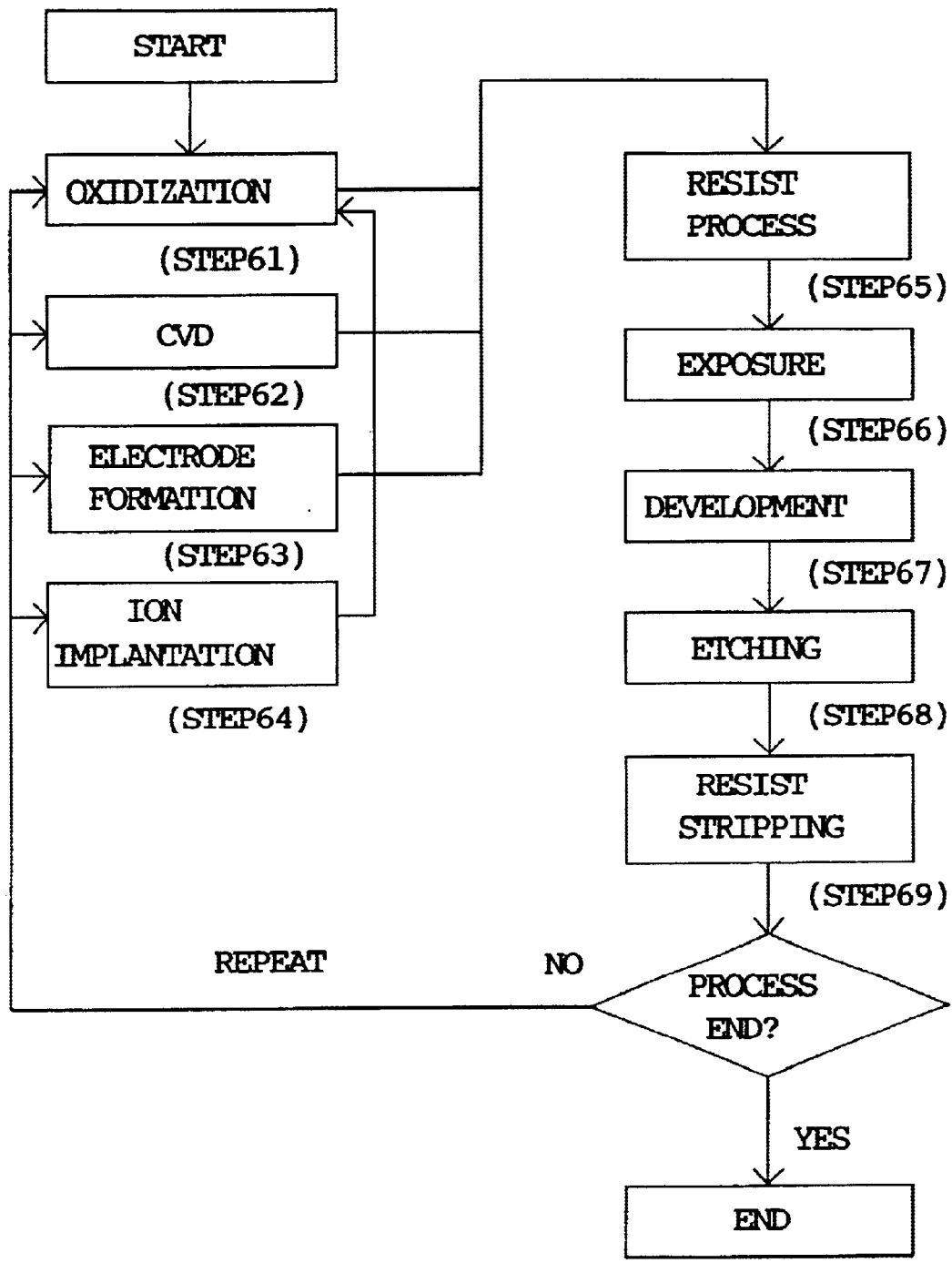
FIG. 26 is a detailed flowchart for step 54 shown in FIG. 25.

Referring to FIGS. 25 and 26, a description will now be given of an embodiment of a device fabricating method using the above mentioned exposure apparatus 1. FIG. 25 is a flowchart for explaining how to fabricate devices (i.e., semiconductor chips such as IC and LSI, LCDs, CCDs). Here, a description will be given of the fabrication of a semiconductor chip as an example. Step 51 (circuit design) designs a semiconductor device circuit. Step 52 (mask fabrication) forms a mask having a designed circuit pattern. Step 53 (wafer making) manufactures a wafer using materials such as silicon. Step 54 (wafer process), which is also referred to as a pretreatment, forms actual circuitry on the wafer through photolithography of the present invention using the mask and wafer. Step 55 (assembly), which is also referred to as a posttreatment, forms into a semiconductor chip the wafer formed in step 54 and includes a assembly step (e.g., dicing, bonding), a packaging step (chip sealing), and the like. Step 56 (inspection) performs various tests for the semiconductor device made in Step 55, such as a validity test and a durability test. Through these steps, a semiconductor device is finished and shipped (Step 57).

FIG. 26 is a detailed flowchart of the wafer process in Step 54. Step 61 (oxidation) oxidizes the wafer's surface. Step 62 (CVD) forms an insulating film on the wafer's surface. Step 63 (electrode formation) forms electrodes on the wafer by vapor disposition and the like. Step 64 (ion implantation) implants ion into the wafer. Step 65 (resist process) applies a photosensitive material onto the wafer. Step 66 (exposure) uses the exposure apparatus to expose a circuit pattern on the mask onto the wafer. The mask has the mask pattern formed in accordance with the above embodiment. Step 67 (development) develops the exposed wafer. Step 68 (etching) etches parts other than a developed resist image. Step 69 (resist stripping) removes disused resist after etching. These steps are repeated, and multi-layer circuit patterns are formed on the wafer. This device fabricating method of this embodiment may manufacture devices with higher quality than the conventional ones. Thus, the device fabricating method using the above mask, and resultant devices serve as one aspect of the present invention.

Further, the present invention is not limited to these preferred embodiments, and various modifications and changes may be made in the present invention without departing from the spirit and scope thereof.

Thus, the present invention may provide an exposure method and apparatus that can expose, without exchanging a mask, a contact hole pattern that has a fine hole diameter and blends from an isolated contact hole to a contact hole line, with high resolution.

What is claimed is:

1. A method for forming, on a mask, a mask pattern used for exposure, which mask pattern includes a first pattern that blends plural types of patterns, and a second pattern that is smaller in size than the first pattern, the mask pattern being arranged on the mask so that the first pattern may be resolved and the second pattern is prevented from being resolved, said method comprising the steps of:

classifying the first pattern into one of a periodic pattern having at least three elements having two equal intervals in at least one direction among two orthogonal directions, an isolated pair pattern that does not belong to the periodic pattern and includes a pair of elements arranged in at least one direction among the two orthogonal directions, and an isolated element that does not belong to the isolated pair pattern and includes only one element without constituting any pair in any of the two orthogonal directions;

arranging the second pattern for the isolated pair pattern;

arranging the second pattern for the isolated element; and arranging the second pattern for the periodic pattern.

2. A method according to claim 1, wherein said step of arranging the second pattern for the isolated element arranges the second pattern utilizing an oblique vector from the isolated element to the isolated pair pattern.

3. A method according to claim 1, wherein said step of arranging the second pattern for the isolated element arranges the second pattern utilizing a width of the isolated element.

4. A method according to claim 1, further comprising the step of fusing first and second elements where the second pattern includes the first and second elements, and an interval between the first and second elements is within a predetermined distance.

5. A method according to claim 1, further comprising the step of arranging only one of first and second elements where the second pattern includes the first and second elements, and an interval between the first and second elements is within a predetermined distance.

6. A method according to claim 5, wherein the first and second elements are provided to the isolated pair pattern, the isolated element and the periodic pattern in this order.

7. A method according to claim 5, wherein the first and second elements are provided to a smaller periodic pattern among two different periodic patterns.

8. A method according to claim 5, wherein the first and second elements are provided to a periodic pattern with a smaller interval among two different isolated pair pattern.

9. A method according to claim 5, wherein the interval is 2 or less when converted into $\lambda/(4NA)$ as a unit where $\lambda$ is a wavelength of exposure light, and NA is a numerical aperture of a projection optical system for transferring the mask pattern onto an object to be exposed.

10. A method according to claim 5, wherein the interval is a distance of 1 or less between two closest parts of two elements when converted into $\lambda/(4NA)$ as a unit where $\lambda$ is a wavelength of exposure light, and NA is a numerical aperture of a projection optical system for transferring the mask pattern onto an object to be exposed.

11. A method according to claim 1, wherein said step of arranging the second pattern for the isolated pair pattern includes the step of arranging two additional elements of the second pattern outside the isolated pair pattern at an interval of the isolated pair pattern in an arranged direction of the isolated pair pattern.

12. A method according to claim 11, wherein said step of arranging two additional elements of the second pattern utilizes a vector from one to the other in the pair of elements in the isolated pair pattern.

13. A method according to claim 12, wherein said step of arranging two additional elements of the second pattern utilizes a vector that is formed by connecting both centers of gravity in the additional elements, to arrange the additional elements if an interval between two closest parts of the pair of elements in the isolated pair pattern in an arrangement direction is about 1 or larger when converted into $\lambda/(4NA)$ as a unit where $\lambda$ is a wavelength of exposure light, and NA is a numerical aperture of a projection optical system for transferring the mask pattern onto an object to be exposed, and wherein said step of arranging two additional elements of the second pattern utilizes a vector that is parallel to the arrangement direction of the isolated pair pattern, has a length of about 2, and includes a center positioned approximately at a center of an element interval, to arrange the additional elements if an interval between two closest parts of the pair of elements in the isolated pair pattern in an arrangement direction is about 1 or less when converted into $\lambda/(4NA)$.

14. A method according to claim 11, wherein said step of arranging the second pattern for the isolated pair pattern includes the step of arranging the second pattern, outside the second pattern arranged outside the isolated pair pattern, in a direction perpendicular to an arrangement direction of the isolated pair pattern.

15. A method according to claim 11, wherein said step of arranging the second pattern for the isolated pair pattern includes the step of arranging the second pattern in a direction perpendicular to an arrangement direction of the isolated pair pattern outside the isolated pair pattern, utilizing the element in the isolated pair pattern.

16. A method according to claim 1, wherein said step of arranging the second pattern for the periodic pattern includes the step of arranging two elements of the second pattern in an arrangement direction of the at least three elements outside the periodic pattern at an interval of the at least three elements.

17. A method according to claim 16, wherein said step of arranging the second pattern for the periodic pattern includes the step of arranging the second pattern, outside the second pattern arranged outside the isolated pair pattern, in a direction perpendicular to an arrangement direction of the at least three elements.

18. A method according to claim 1, further comprising the step of arranging the second pattern by expanding the second pattern that has already been arranged.

19. A method according to claim 18, wherein said step of expanding utilizes a vector used for the second pattern that has already been arranged.

20. A method according to claim 1, wherein said classifying step includes the steps of:

detecting another element closest in the two orthogonal directions to an object element included in the first pattern;

determining, when the closest element has been detected, whether there is another element in a detected direction at a position from the closest element as a starting point using a first vector from the object element to the closest element;

determining whether there is another element in a direction opposite to the detected direction at a position from the closest element as a starting point using a second vector from the closest element to the object element; and determining that the object element is the periodic pattern when two or more other elements are detected to exist in two directions along at least one line on which the object element is placed.

21. A method according to claim 20, further comprising the step of determining that an element in the periodic pattern is an element at a border of the periodic pattern, when there is no other element at a position at an extension of the first or second vector in at least one direction from the element as a starting point in the periodic pattern.

22. A method according to claim 21, further comprising the step of arranging the second pattern using the first and/or second vectors from the element at the border.

23. A method according to claim 21, further comprising the step of determining that the element is a side element at the border in the periodic pattern when the number of directions is one in which there is no other element at an extension of the first or second vector in one direction, and that the element is a vertex element in the periodic pattern when the number of directions is two in which there is no other element at an extension of the first or second vector in one direction.

24. A method according to claim 23, further comprising the step of arranging the second pattern for the vertex element utilizing the second pattern that has already been arranged and a vector different from that used to arrange the second pattern that has already been arranged.

25. A method according to claim 1, wherein said step of arranging the second pattern in an arrangement direction of the isolated pair pattern arranges the second pattern between the isolated pair pattern when an interval between the isolated pair pattern is larger than a predetermined distance.

26. A method according to claim 25, wherein the predetermined distance is about 4 or greater when converted into $\lambda/(4NA)$ as a unit where $\lambda$ is a wavelength of exposure light, and NA is a numerical aperture of a projection optical system for transferring the mask pattern onto an object to be exposed.

27. A method according to claim 25, wherein said step of arranging the second pattern in the arrangement direction of the isolated pair pattern for the isolated pair pattern includes the step of arranging two elements of the second pattern outside the isolated pair pattern in the arrangement direction at an interval between one of the isolated pair pattern and an element of the second pattern arranged between the isolated pair pattern.

28. A method according to claim 1, wherein said classifying step considers there are two isolated elements when an interval between the pair of elements arranged in any one of the two orthogonal directions is greater than a predetermined distance.

29. A method according to claim 28, wherein the predetermined distance is about 6 or greater when converted into $\lambda/(4NA)$ as a unit where $\lambda$ is a wavelength of exposure light, and NA is a numerical aperture of a projection optical system for transferring the mask pattern onto an object to be exposed.

30. A method according to claim 28, wherein said step of arranging the second pattern for the isolated element includes the steps of:

detecting the closest element other than the two orthogonal directions;

calculating third and fourth vectors by projecting a vector from the closest element to the isolated element in the two orthogonal directions; and arranging an element in the second pattern at a position at an extension of the third vector and at an extension of the fourth vector from the isolated element as a starting point.

31. A method according to claim 30, wherein the closest element belongs to the isolated pair pattern.

32. A device fabricating method comprising the steps of:

exposing a first pattern on a mask onto a substrate, said mask is made by a method for forming, on the mask, a mask pattern used for exposure, which mask pattern includes a first pattern that blends plural types of patterns, and a second pattern that is smaller in size than the first pattern, the mask pattern being arranged on the mask so that the first pattern may be resolved and the second pattern is restrained from being resolved, said method comprising the steps of classifying the first pattern into one of a periodic pattern having at least three elements having two equal intervals in at least one direction among two orthogonal directions, an isolated pair pattern that does not belong to the periodic pattern and includes a pair of elements arranged in at least one direction among the two orthogonal directions, and an isolated element that does not belong to the isolated pair pattern and includes only one element without constituting any pair in any of the two orthogonal directions, arranging the second pattern for the isolated pair pattern, arranging the second pattern for the isolated element, and arranging the second pattern for the periodic pattern; and performing a predetermined process for the exposed object.

* * * * *